(12) United States Patent
O'Harra, II

(10) Patent No.: US 7,271,576 B1
(45) Date of Patent: Sep. 18, 2007

(54) HAND HELD ANTENNA/NETWORK IMPEDANCE ANALYZER

(76) Inventor: Dale G. O'Harra, II, 2513 Carmelita Ave., Belmont, CA (US) 94002

( * ) Notice: Subject to any disclaimer, the term of this patent is extended or adjusted under 35 U.S.C. 154(b) by 0 days.

(21) Appl. No.: 11/361,945

(22) Filed: Feb. 24, 2006

Related U.S. Application Data

(60) Provisional application No. 60/657,276, filed on Mar. 1, 2005.

(51) Int. Cl.
  *G01R 23/00* (2006.01)
(52) U.S. Cl. .............................. 324/76.19; 324/76.22; 324/73.1
(58) Field of Classification Search .............. 324/76.19
  See application file for complete search history.

(56) References Cited

U.S. PATENT DOCUMENTS

| | | | |
|---|---|---|---|
| 4,237,617 A | * | 12/1980 | Goussios ...................... 33/427 |
| 4,871,971 A | * | 10/1989 | Jeerings et al. ............. 324/509 |
| 6,407,539 B1 | * | 6/2002 | Struck et al. ................. 324/72 |
| 7,030,627 B1 | * | 4/2006 | Ashley ........................ 324/650 |
| 2005/0083068 A1 | * | 4/2005 | Clarridge et al. ........... 324/601 |
| 2006/0132302 A1 | * | 6/2006 | Stilp ..................... 340/539.22 |

OTHER PUBLICATIONS

Straw, Ed., The ARRL Antenna Book, 19th Ed., ARRL, Newington, CT Chapter 27 , pp. 27-1 to 27-8. 2000, no month available.
Barker, "Improved Remote Antenna Impedance Measurement", QEX Magazine, ARRL, Newington, CT., Jul.-Aug. 2004, pp. 33-42.
Brochure, "VIA Bravo Analyzer", AEA Technology, Vista, CA (2 pages). 2004, no month available.
Article, "Micro98 Antenna Analyst", American QRP Club, (11 pages) 2005, no month available.
Brochure, "VA1 RX Vector Analyst", Autek Research, Wesley Chapel, FL., (3 pages) 2003, no month available.

* cited by examiner

*Primary Examiner*—Vincent Q. Nguyen
(74) *Attorney, Agent, or Firm*—David B. Harrison

(57) ABSTRACT

A handheld portable battery powered digital antenna and/or network analyzer which derives complex impedance values at a given frequency includes an internal direct digital synthesis generator and provides software-defined multiple operating modes and real time graphic scalar and polar displays of results in a multiplicity of user-selectable visual formats.

18 Claims, 18 Drawing Sheets

Data Resolution 12 bits    A/D
    4 bits    PGA
    2 bits    Loop counter = 16, sqrt = 4, = 2 bits
    1.5 bits    Sqrt 8 averaged samples = 2.8, = 1.5 bits 19.5 bits effective dynamic range

HAND HELD ANTENNA/NETWORK IMPEDANCE ANALYZER

REFERENCE TO RELATED APPLICATION

The benefit of U.S. Provisional patent application Ser. No. 60/657,276, filed on Mar. 1, 2005, and entitled "Hand Held Antenna/Impedance Analyzer" is hereby claimed, and the disclosure thereof is hereby expressly incorporated by reference.

FIELD OF THE INVENTION

The present invention relates to portable electronic test apparatus and methods. More particularly, the present invention relates to a handheld battery powered multi-mode digital antenna and/or network analyzer which directly derives complex impedance values at a given frequency controlled by an internal direct digital synthesis generator and provides software-defined multiple operating modes and real time graphic display of results in a multiplicity of user-selectable visual formats.

BACKGROUND OF THE INVENTION

A Wheatstone bridge implemented as a directional coupler is a well-known impedance measurement circuit. It is also known to implement an impedance measurement circuit as a hybrid coupler, i.e., a four-port circuit that has an electrical response such that signals applied to first and second ports provoke a measurement response that is divided between a third, fourth, fifth and sixth output ports. Directional couplers are described in a variety of versions in Straw, Ed., *The ARRL Antenna Book* $19^{th}$ *Ed.*, ARRL, Newington, Conn., Copyright 2000, Chapter 27, pp. 27-2 through 27-35. A variety of 50 ohm and 75 ohm directional couplers are available commercially from Mini-Circuits, Brooklyn, N.Y. A monolithic IC solid state RF gain and phase detector circuit, type AD8302, is available from Analog Devices, Norwood, Mass.

Directional couplers are used to measure amplitudes and phases of unknown complex impedance, such as an unknown impedance at an antenna feed point, or an input connection of a transmission line leading to an antenna feed point, for example. One technique for measuring antenna impedance remotely is set forth in R. Barker, "Improved Remote Antenna Impedance Measurement", *QEX* magazine, Published by ARRL, Newington, Conn., Jul./Aug. 2004, pages 33-42, the disclosure thereof being incorporated herein by reference.

Handheld portable battery powered antenna analyzers are known in the art. These analyzers typically include an RF frequency generator, a hybrid coupler for coupling the frequency generator to an antenna feed point or transmission line, and a detector for detecting and displaying forward and reflected voltages, for example. Examples of battery-powered analyzers include commercial offerings by AEA, Autek, MFJ, Bird, and the American QRP Club (NJQRP). Many of the low cost battery powered antenna analyzers employ a relatively unstable oscillator as a frequency generator to excite the unknown impedance in order to derive impedance data for measurement. These low cost analyzers augment the unstable oscillator by providing a more accurate time base frequency counter and display. A few analyzers may employ phase lock loop techniques to provide the frequency generator. And, a few others may use direct digital synthesis for the frequency generator.

Handheld vector network analyzers using LC oscillator frequency sources or phase locked loops are known in the art.

LCD displays have been used in these instruments, but have not heretofore used high contrast color transreflective LCD graphic displays needed for effective outdoor daylight operation in the field. In addition, such instruments have not included functionality to characterize and store feed line impedance (compare the Barker QEX article cited above where the technique described is very complex to carry out).

Also, such instruments have not included software-defined graphic user display capabilities for providing the measurement results in a plurality of user-selected formats, including real time Smith Chart, for example, (or Arndt Chart graphing real and complex Rho (complex voltage reflection coefficient, see Walter Maxwell, Reflections II, Transmission Lines and Antennas, WorldRadio Books, Sacramento, Calif., copyright 2001, Chapter 3).

SUMMARY OF THE INVENTION WITH ASPECTS

My advance in the art is an improved user interface and increased functionality in a small self-contained battery powered analyzer which most preferably includes a high contrast color display. Further, my unit includes the ability to measure and record in memory, measurement values for later use and display or download for further analysis and/or use by powerful computing equipment.

My analyzer employs a multi-mode control program and uses e.g. four software-defined user pushbuttons for control. Each pushbutton is physically aligned and associated with a visual display switch function box on the display screen which changes with changing function of the particular pushbutton. This arrangement provides a convenient, highly intuitive, and highly flexible human interface with all of the control values being provided by the user with a minimum number of pushbuttons. The function of each pushbutton is subject to change depending upon functional mode of the analyzer and is labeled in the associated visual indicator box on the display screen for user convenience. The rotary encoder can perform all frequency settings and memory location selection functions. A fifth pushbutton incorporated into the encoder shaft provides a convenient way to select digit positions of the frequency being adjusted by rotation of the encoder shaft, for example. Moreover, the complex (real and imaginary, or magnitude and phase) measurement data may be plotted in a variety of user-selectable display types to aid the user in visualizing and understanding the object or environment in which measurement is being made.

The functional and graphic display capabilities of my unit are directly a result of the design, layout and packaging of the unit, which forms an important aspect of the present invention, including use of a very powerful mixed analog/digital signal embedded microprocessor including considerable flash memory resources for reading and digitally quantizing measurement values and for driving an on-board direct digital synthesizer chip. The microprocessor directly controls a visual display process driving a transreflective color LCD display, and also provides at least one port to enable connection to an external computing resource. User inputs include a rotary quadrature encoder and a plurality of user push button switches. The software enables multiple functions to be carried out with the encoder and switches, based on software-defined functions selected by the user at the push button switches. Available functions are conveniently displayed to the user in proximity with the appropriate push button switches. This approach facilitates an efficiently small handheld package with considerable functionality with a minimum of controls and user inputs. A high-resolution calibration mode enables the user to calibrate the internal direct digital synthesis generator against a known frequency standard. A graphics setup mode enables the user to set a variety of available display parameters. For example, in one preferred embodiment the user may rapidly set a single cursor to a center frequency of interest in a current frequency sweep display. Once set, a push button enters a two-cursor mode that enables the user to adjust the sweep width as centered about the originally set cursor.

One aspect of the invention provides for user-selectable fixed frequency, swept frequency and field strength measurement operating modes. The user-selectable graphic formats presented by the graphic display unit include numerical field, bar graph, sweep and line X-Y coordinate, Smith Chart and complex reflection coefficient phasor graph formats, for example.

A further aspect of the invention provides a remote antenna measurement mode, for example. This mode includes software defined steps for measuring and recording complex impedance on an open or shorted antenna transmission line and recalling and using the saved transmission line impedance in carrying out a compound calculation of antenna measurement data results collected remotely via the same transmission line after it has been connected to the antenna feed point.

Another aspect of the design is the PCB layout of a two-layer printed circuit board that effectively separates the analog and digital processes, and that further enables the LCD module to be connected as a daughter board.

The use of a four-port directional coupler, programmable gain analog amplifiers, a 12-bit analog to digital converter, and a software autogain routine enables realization of a 19.5 bit effective data resolution.

These and other objects, advantages, aspects and features of the present invention will be more fully understood and appreciated upon consideration of the detailed description of preferred embodiments presented in conjunction with the following drawings.

DETAILED DESCRIPTION OF A PREFERRED EMBODIMENT

Figure 1:
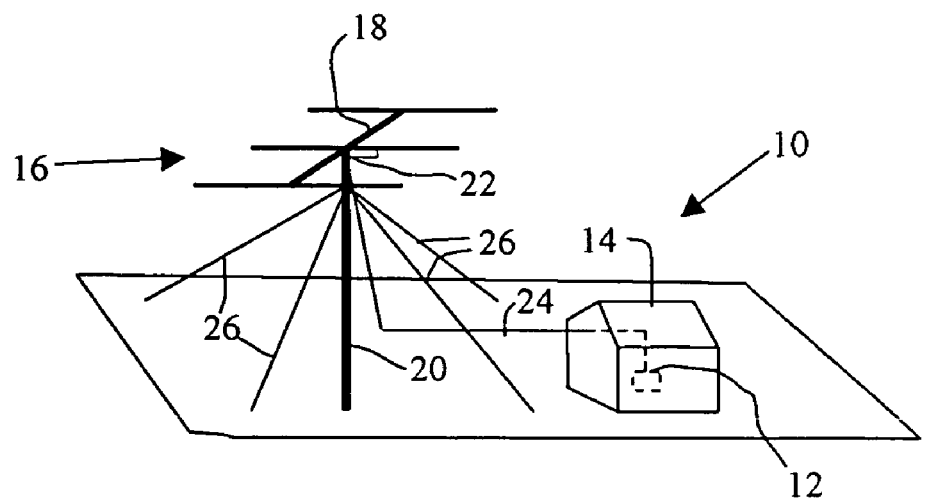
FIG. 1 is a diagrammatic view of an antenna and transmitter installation setting forth one intended environment of use of the antenna analyzer of the present invention.

FIG. 1 illustrates in simplified view a radio transmitting installation 10 including transmitter apparatus 12 in a shelter 14, a multi-element Yagi or log periodic directional beam antenna 16 mounted to a beam 18 at the top of a tower 20. In the present example, the antenna is designed and intended to operate in the high frequency and low very high frequency bands, such as between 3.5 MHz and 54 MHz. While a horizontally polarized beam antenna array is illustrated, other antenna types, including dipoles, verticals, etc., may be measured and characterized by the antenna analyzer of the present invention.

The antenna 16 includes a feed point 22 to which is connected a transmission line 24 leading down the tower 20 an over to the transmitter apparatus 12. The tower 20 may be free standing or it may be stabilized in place by guy wires 26 as is well known in the art. In order to adjust properly the transmitter apparatus 12 for maximum power transfer to the antenna 16, the impedance at the feed point needs to be determined and/or adjusted. One method for measuring feed point impedance is to make measurements while the antenna 16 is assembled on or slightly above the ground but before the antenna 16 is mounted onto the tower. A more preferable method is to climb the tower and attach an antenna analyzer directly to the feed point 22 with a minimum-length cable connection and make feed point measurements and adjustments with the antenna at its designed operating height. Obviously, a small self-contained, hand-held instrument is needed to make such measurements. The present invention represents an improvement in antenna analyzers useful for making field measurements of the type contemplated within the FIG. 1 environment.

Figure 2:
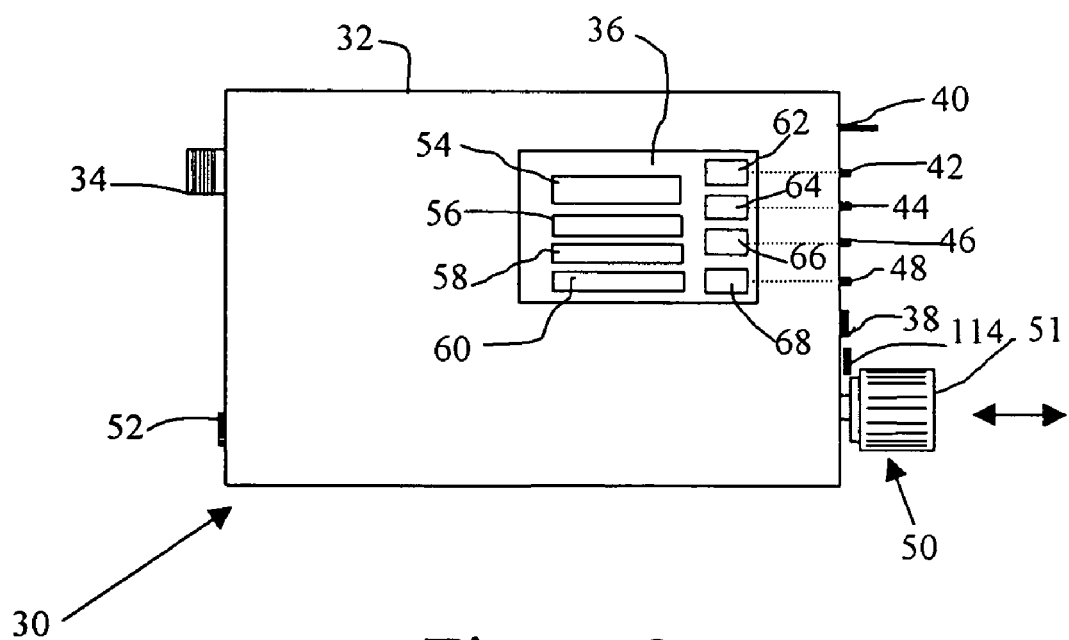
FIG. 2 is a plan view of one preferred embodiment of the analyzer of the present invention showing connection, control and display structural elements.

FIG. 2 shows an antenna analyzer 30 in accordance with principles of the present invention. The analyzer, weighing less than two pounds is contained in a suitable elongated rectangular box-shaped housing 32 having preferred dimensions of 7.5 inches across, 4.25 inches high and 1.625 inches deep. An RF connector 34, such as a SO-239 fitting, enables the analyzer 30 to be connected to a device to be tested, such as to the feed point 22 of the antenna 16 of FIG. 1, with a suitable length of transmission line (as short as practical, the shorter the better). A window in the top major surface of the housing 32 permits the user to view data measurement and calculational results via a bright sunlight readable (transreflective) 6.92 cm diagonal reflective 240 by 160 pixel graphic color liquid crystal display module 36 having an internal backlight of indoor or night time operations. A jack 38 enables connection to a bidirectional serial data communications port enabling the analyzer 30 to be connected to a host computing system for program and measurement data transfers. The serial port at jack 38 enables the analyzer 30 to be updated and further enables data to be collected in the field and then downloaded for further analysis, reporting and storage at a central computing location. The jack 38 also embodies a means for connection to additional optional equipment and provides e.g., a digital signal that could be used for instance to indicate the start of sweep, an analog input signal that could be digitized for instance to determine field strength, an analog output signal that could be used for instance to sweep an oscilloscope in the X-axis synchronously with the sweep of the analyzer 30 thus enabling the exemplary analyzer 30 in conjunction with a standard oscilloscope to make accurate 4 port swept frequency device measurements. An additional port 114 allows the same functionality of the serial data at jack 38 to be available to a standard universal serial bus connection. An on-off push button 40 (or button) controls internal power management circuitry enabling the battery powered analyzer to be turned on and off. An internal timer is provided with the power control circuit 130, and when enabled by the user, automatically powers down the analyzer 30 after a predetermined period of user inactivity as measured at the push buttons, encoder, and ports. Four software-defined-functionality user control momentary-contact push buttons 42, 44, 46 and 48 are arranged along the right side of the analyzer 30 adjacent to the LCD display window 36. A rotary shaft encoder 50 generates two-bit quadrature values as a user rotates a knob 51 and thereby enables the user to adjust operating parameters of the analyzer in up and down increments. The encoder 50 also includes a spring-loaded momentary-contact push button, so that the user may depress the knob 51 and thereby provide further control input to the analyzer 30, such as adjustment step size, for example. A jack 52 enables a line-connected battery charging power supply to be connected to the analyzer 30 to enable the internal batteries to be recharged. Other jacks are provided to provide external connections for other functions and capabilities of the analyzer 30, as described in greater detail hereinafter.

The LCD display 36 provides the user with a variety of graphical presentations. Most preferably, the display 36 provides a high-resolution color graphical depiction of measurement parameters for each of the display formats. In the presently preferred implementation, a separate microprocessor handles high level graphics routines, e.g. draw a line, draw a circle, fill an area, and interfaces between CPU 104 and a graphics controller integrated circuit directly controlling each color pixel of the LCD graphics display screen. This dual-processor approach relieves the main CPU 104 from having to address each individual pixel on the display thus not interfering with all of the control, data-acquisition and I/O tasks that comprise the main CPU 104 workload. A means of communication e.g. an eight bit bi-directional port between the main CPU 104 and the graphics display processor is used to transmit the CPU's commands to engage the high level graphics routines, and to receive the current display status. In FIG. 2, the display 36 presents a numerical value data field 54, three bar graphs 56, 58 and 60, and four push-button functional indicator boxes 62, 64, 66, and 68. Each indicator box is physically associated with a push-button switch. Thus, the box 62 associates with button 42, the box 64 associates with button 44, the box 66 associates with button 46 and the box 68 associates with button 48. By having dynamically reassignable function boxes on the display 36, the functions of push buttons 42-48 can be altered and extended, depending upon particular operating mode of the analyzer. Also, this arrangement is highly intuitive, and minimizes learning time for the user.

Figure 3:
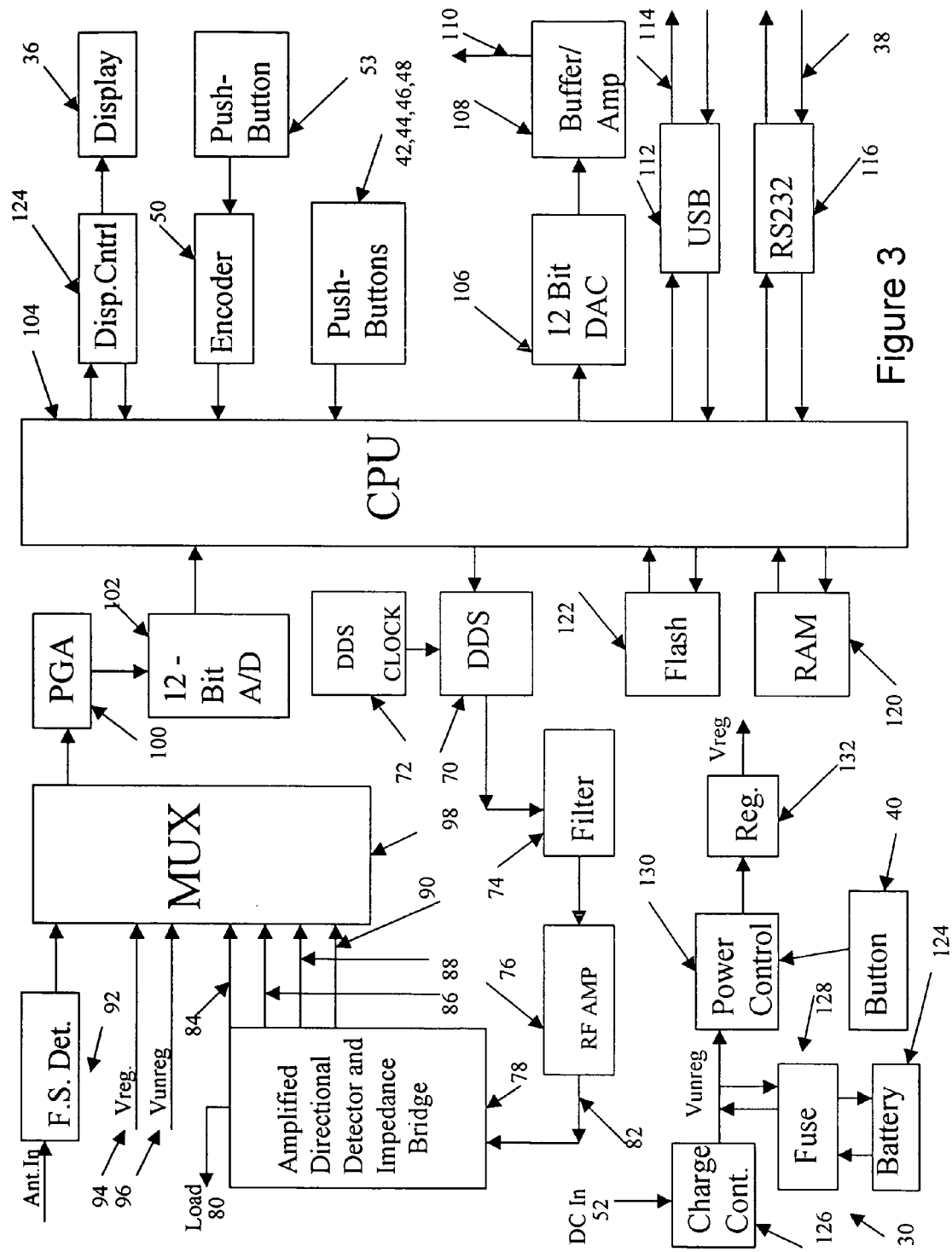
FIG. 3 is a detailed electrical block diagram of the FIG. 2 analyzer.

Turning now to the FIG. 3 block diagram of the analyzer 30, selectable radio frequencies are generated by a commercially available direct digital synthesizer integrated circuit ("DDS") 70, e.g. the AD9850 made by Analog Devices, Inc. The FIG. 3 circuit uses a crystal controlled reference clock generator 72 operating at 125 MHz, for example. This relatively high clock frequency enables the DDS 70 to synthesize RF waveforms in a range between 200KHz and 60 MHz, for example. An RF output from the DDS 70 is first passed through a two-stage elliptical low pass filter 74 to remove unwanted spurious outputs from the DDS and is then passed through a monolithic microwave integrated circuit (MMIC) amplifier 76 to increase signal level to provide a useful excitation signal level for carrying out the complex impedance measurements of the structure or device under test. By using a DDS, the frequency generator provides an accurate, rapidly modifiable RF signal source. Therefore, no counter is required to measure and indicate excitation frequency.

Measurement of the structure or device under test is by way of a multi-port directional coupler between the signal source and the device under test. The directional coupler 78 can comprise a Wheatstone impedance bridge or other suitable circuitry for providing suitable analog amplitude measurement data values from which reflection component phase may be determined or derived (the degree of reflection wave lead or lag relative to excitation wave). The presently preferred circuitry of a 50 ohm impedance four-port coupler 78 is shown in the detailed circuit diagram of FIG. 3A. The coupler 78 includes an antenna input port 80, a DDS excitation output port 82, and four measurement ports, including a forward voltage measurement port 84, a reflected voltage measurement port 86, an input voltage amplitude measurement port 90, and a DDS output voltage amplitude measurement port 88 that measures the amplitude of the DDS amplified and filtered output from amplifier 76. The ports 84 and 86 enable forward and reflected voltage amplitudes to be measured. Ports 88 and 90 enable impedance to be measured. The combination of all of the ports 84, 86, 88, and 90 enable phase to be calculated. With the impedance bridge implementation shown in FIG. 3A, the four separate measurement outputs enable relationship between these outputs to be mathematically manipulated to determine the complex impedance characteristics of the structure or device under test.

In calculating data results from the values measured by ports 84, 86, 88 and 90, the analyzer employs digital software in solving the following equations and relationships:

SWR=abs((V(forward)+V(reverse))/(V(forward)−V(reverse)))=(1+rho)/(1−rho);

Z=(V(across antenna)*50)/(V(source)−V(across antenna));

R=(((50)^2+Z^2)(SWR))/((SWR^2+1)*50);

X=SQRT((*Z*Z)−(R*R)); and,

Theta=arctan(X/R);

where SWR is the standing wave ratio, Z is the magnitude of the complex impedance vector in a polar coordinate system, R is the magnitude of the real part of the complex impedance in a real and imaginary plane, X is the magnitude of the imaginary part of complex impedance in the real and imaginary plane, and Theta is the angle of the complex impedance in the polar coordinate system. The complex reflection coefficient RHO can readily be derived from measurements and calculations of SWR and Z. The analyzer 30 employs digital software routines for converting calculated data results between rectangular coordinates and polar coordinates in providing user-selected displays of data results from measurement.

Analog data values from the four bridge ports 84, 86, 88 and 90, and from other sources including amplified field strength measurement from a field strength detector 92 (optional), various diagnostic internal voltage and temperature measurements 94 and 96, etc., are amplified in amplifiers 79 and then fed into an analog multiplexer 98. In the case of the bridge measurements, a standard technique for compensating for non-linearity of each diode within the bridge is carried out by controlling gain of an associated amplifier 79 in front of the multiplexer 98. The output of the multiplexer 98 feeds a programmable gain amplifier 100 for controlling gain of each selected analog data channel. The gain-controlled data is then quantized by a 12 bit A/D converter 102 clocked e.g. at 100 kHz and operating in a highly oversampled mode. The multiplexer 98, programmable gain amplifier 100, and A/D converter 102 are all controlled by a programmed main microprocessor (CPU) 104. The CPU 104, in addition to controlling the DDS 70 and collecting the measurement data via the A/D 102, also receives user control inputs from the four push buttons 42, 44, 46 and 48, the rotary shaft encoder 50, the shaft encoder push button 53, and RS 232 serial data via exterior data port jack 38, for example. The CPU 104 also includes and supports a 12-bit digital-to-analog converter 106 and buffer amplifier 108 providing an analog sweep output 110, a universal serial bus (USB) driver 112 providing a USB serial port 114, and an RS-232 serial port 116, the port 116 being available externally at the jack 38. Most preferably, the input to the A/D 92 and the output 110 of the DAC 106 and buffer 108 are presented at a single connector jack e.g. adjacent to the USB connector jack. The CPU 104 also includes random access memory (RAM) 120 and flash memory 122. The CPU 104 feeds measurement parameters and data to an associated display controller 124 which directly drives and controls the high-contrast transreflective color LCD display 36 so as to provide visual output of data to the user in a programmably rich variety of display formats by employing conventional pixel-based graphic-mode addressing and display techniques. Simultaneously, the CPU 104 records selected measurement data in the flash memory 122 for later download and off-unit computer analysis and display via the serial port 116, for example. Most preferably, the CPU 104 is included within a VLSI integrated circuit, type C8051F124, by Cygnal, a division of Silicon Labs. The CPU 104 is clocked at 50 MHz. The reader is referred to a Cygnal data sheet: "C8051F120/1/2/3/4/5/6/7C8051F130/1/2/3/ Mixed Signal ISP Flash MCU Family", which describes the presently preferred implementation of CPU 104 and its on-chip peripheral analog and digital circuitry in greater structural and electrical detail, the disclosure of which is hereby incorporated herein by reference. The presently preferred LSI chip including CPU 104 also includes MUX 98, PGA 100, A/D 102, DAC 106, UARTS for RS232 Ports 116 and 118, RAM 120, and Flash Memory 122, for example.

The analyzer 30 includes a battery power supply 124 comprising four 1.5-volt AA size nickel-metal-hydride rechargeable cells. Charging voltage delivered via jack 52 from an out board supply passes through a charge-control circuit 126, and a fuse 128 to charge the battery 124. Unregulated voltage operating power from the battery is delivered to the analyzer circuitry via a power control circuit 130 operating under control of the user-activated power control button 40. The power control circuit 130 has a section that remains actively powered at all times and monitors the power control button 40. When depressed, the button closure is sensed, and the power control circuit 130 applies power to the analyzer circuitry. The analyzer 30 may be turned off by again pressing the control button 40, or a user-settable timer may automatically turn power off after a time interval during which the user has made no data entries to any of the user input controls or ports. A voltage regulator 132 distributes regulated voltage to the analyzer circuitry requiring a regulated power supply.

Packaging of the analyzer 30 has been designed with user convenience as a priority. The heaviest internal parts (the battery cells) are placed in the package at the lower left corner forming a stable center of gravity at a location where the package 32 is naturally gripped by the user's left hand, leaving the user's right hand free to operate the rotary encoder knob 51, the push buttons 42, 44, 46, 48, and the power switch 40 while the user simultaneously views the screen of the display 36. The display screen includes back lighting for environments of low ambient lighting or for night use in the field. The main printed circuit board (PCB) layout is so arranged as to effectively separate the analog and digital processes coupled together via a single common ground point. The physical layout arrangement shown in FIG. 4 enables effective separation of the analog and digital processes while still permitting a two-layer circuit board to be used to reduce overall cost. The main PCB layout shown in FIG. 4 enables the LCD display 36 and display controller module 124 to be connected as a daughter board (broken line rectangle) in a digital area of the main circuit board including the CPU 104.

Figure 3A:
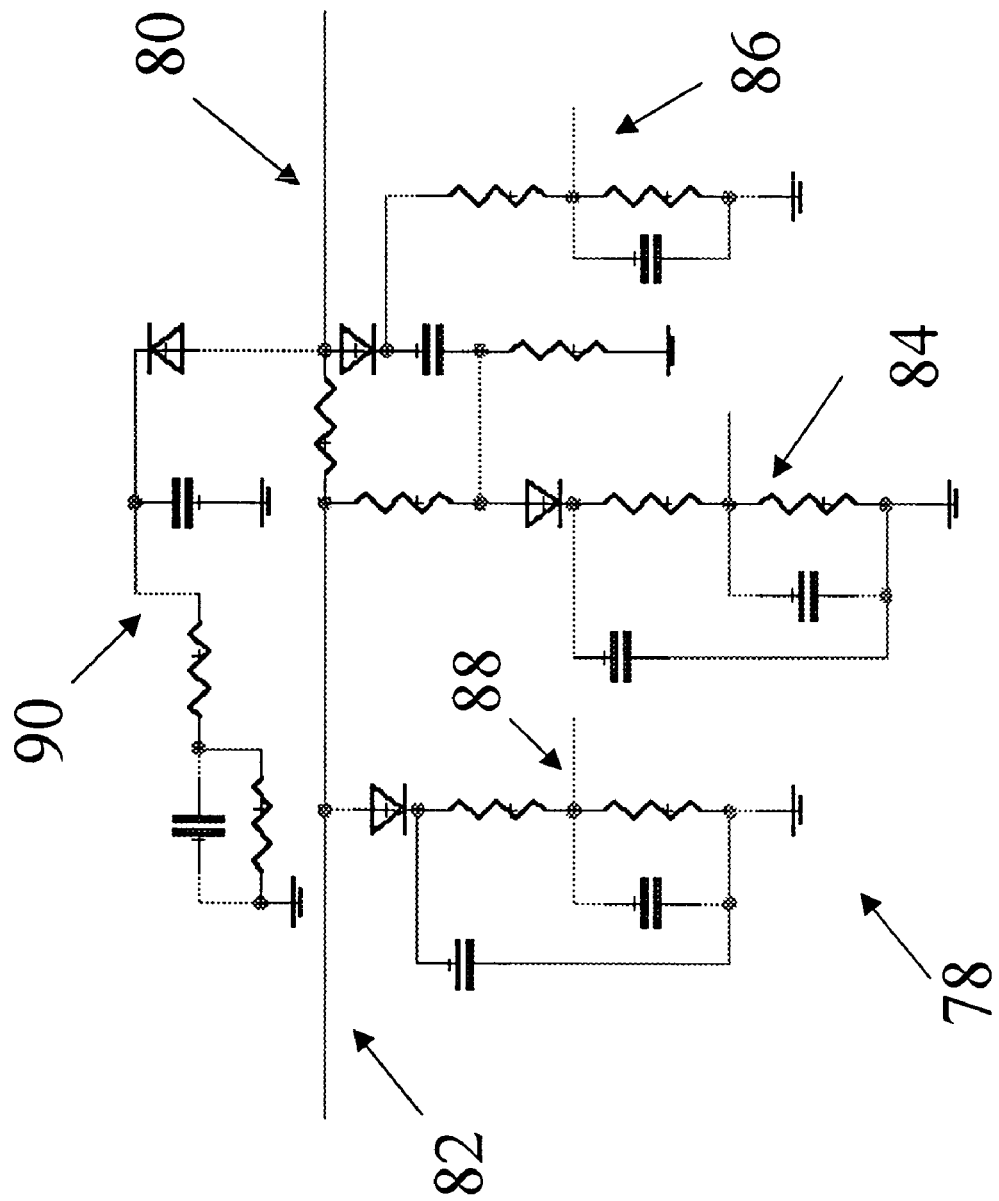
FIG. 3A is a detailed schematic circuit diagram of a directional coupler element of the FIG. 2 analyzer.
Figure 4:
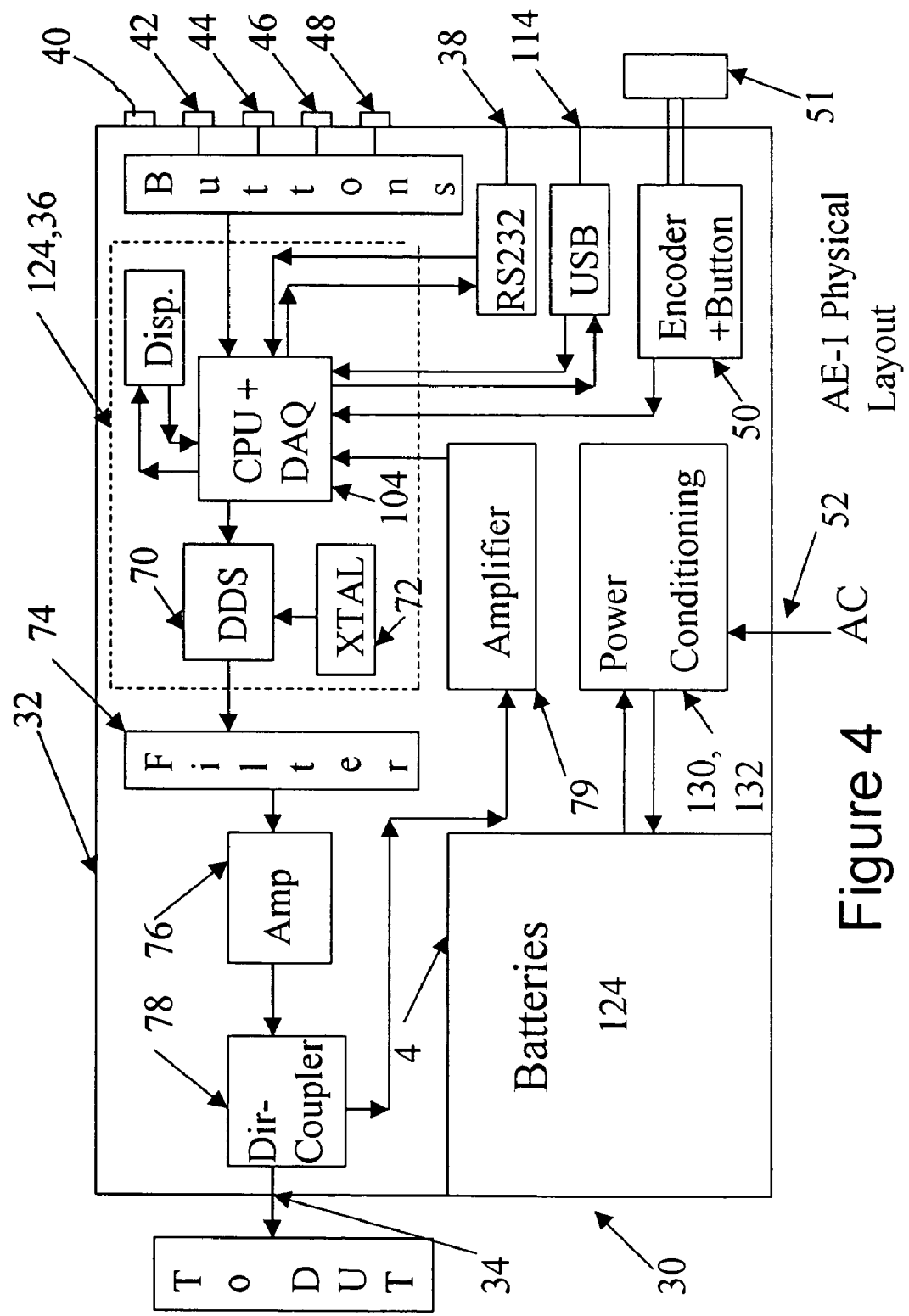
FIG. 4 is a structural layout plan of the FIG. 2 analyzer.

FIG. 4 provides a diagrammatic overview of a presently preferred main PCB layout for the circuit board containing the FIGS. 3 and 3A electronic circuit elements. A daughterboard containing the display controller module 124 and the display 36 attaches and connects to the main PCB via a dual socket-header arrangement in the area surrounded by the dashed line box. Presently preferred for the display controller module and the display is a dual board module type EZLCD-001 provided by EarthLCD.com. The display controller employs, among other features, a programmed Atmel AVR microcontroller, and the high-contrast backlit transreflective LCD display comprises a SONY Model ACX 705AKM7.

Figure 5:
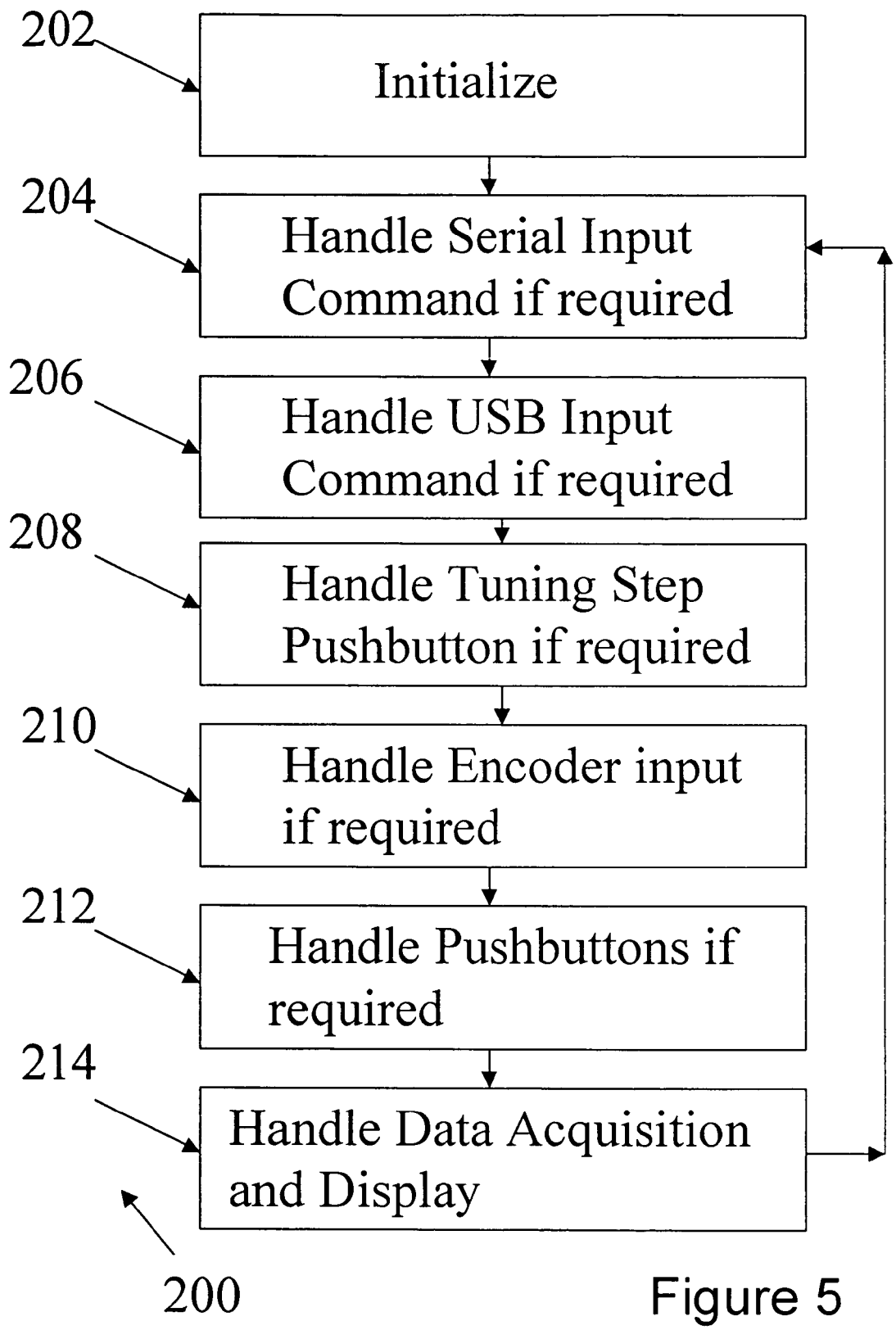
FIG. 5 is flow diagram of a main loop executed by a main microcontroller within the FIG. 2 analyzer.

Turning now to the FIG. 5 flow diagram of a main control loop 200, at power-up and whenever an on-board hard reset momentary contact pushbutton is depressed, the CPU 104 enters an initialization mode 202. In this mode, the CPU initializes all peripherals including the DDS 70, the display controller 124, and appropriate on-chip registers, timers, and functional elements such as the A/D 102 and the DAC106, for example. Once initialization is complete, the display 36 presents an initial display depicted in FIG. 11, for example. The main loop 200 then enters a process block 204 at which the CPU checks to see if a command input is present at the RS-232 port 116. If so, the CPU handles the serial input command before progressing to the next block. The next block 206 determines if a command input is present at the USB port 112. If the USB port 112 has a command ready, the CPU 104 handles the command before progressing to the next block within the main loop. A suitable USB connector can be provided at the port jack 114. The next block 208 determines if the user has depressed the push button 53 associated with the rotary encoder 50. If the encoder push button 53 is depressed, the CPU 104 handles this input, as by stepping through a series of frequency input adjustment step sizes, progressing for example from the MHz units digit position, to the 100 kHz digit position, to the 10 kHz digit position, to the 1 kHz digit position, and then back to the MHz units digit position, so that the user can selectively adjust each digit position by rotating the encoder knob 51 to cause an increase or decrease in the selected digit position value, depending upon direction of rotation of knob 51. Once the encoder push button switch 53 has been handled at block 208, the CPU 104 advances to a block 210 at which it handles any incremental quadrature step inputs from rotation of the encoder 50. Since the two outputs of encoder 50 are in phase quadrature, the CPU 104 can readily determine the direction of rotation of the encoder shaft and thereby cause an increase or decrease in user-commanded frequency input. Once an input from the encoder 50 is handled, the CPU 104 advances to a block 212 which determines if any one of the four user push buttons 42, 44, 46, 48 has been depressed. If a pushbutton 42, 44, 46 or 48 is depressed, the CPU changes operating mode by calling a specified subroutine, etc. The analyzer 30 is mode-driven. Whenever a user input is sensed, an operating mode, and most frequently a corresponding display mode, is changed. When a mode is changed, the CPU determines what is to be done with the data acquired during the data acquisition process and then carries out the selected mode in the data handling and display block 214 of the main loop 200. When the CPU 104 reaches the data handling and display block 214, a number of separate steps are carried out, as is described in FIG. 6. Once the functions and requirements of block 214 are handled, the processor 104 returns to the block 204 and repeats the main loop 200. While the user may select many different operating/display modes, the CPU 104 always follows the process flow of the main loop 200.

While FIG. 5 sets forth a main loop, there are a variety of interrupts, including an interrupt for timing data acquisition at the A/D 102, for clocking the USB and serial ports 112, 116 and 118, and for other functions requiring specific time intervals, such as an automatic power-down timer, for example.

Figure 6:
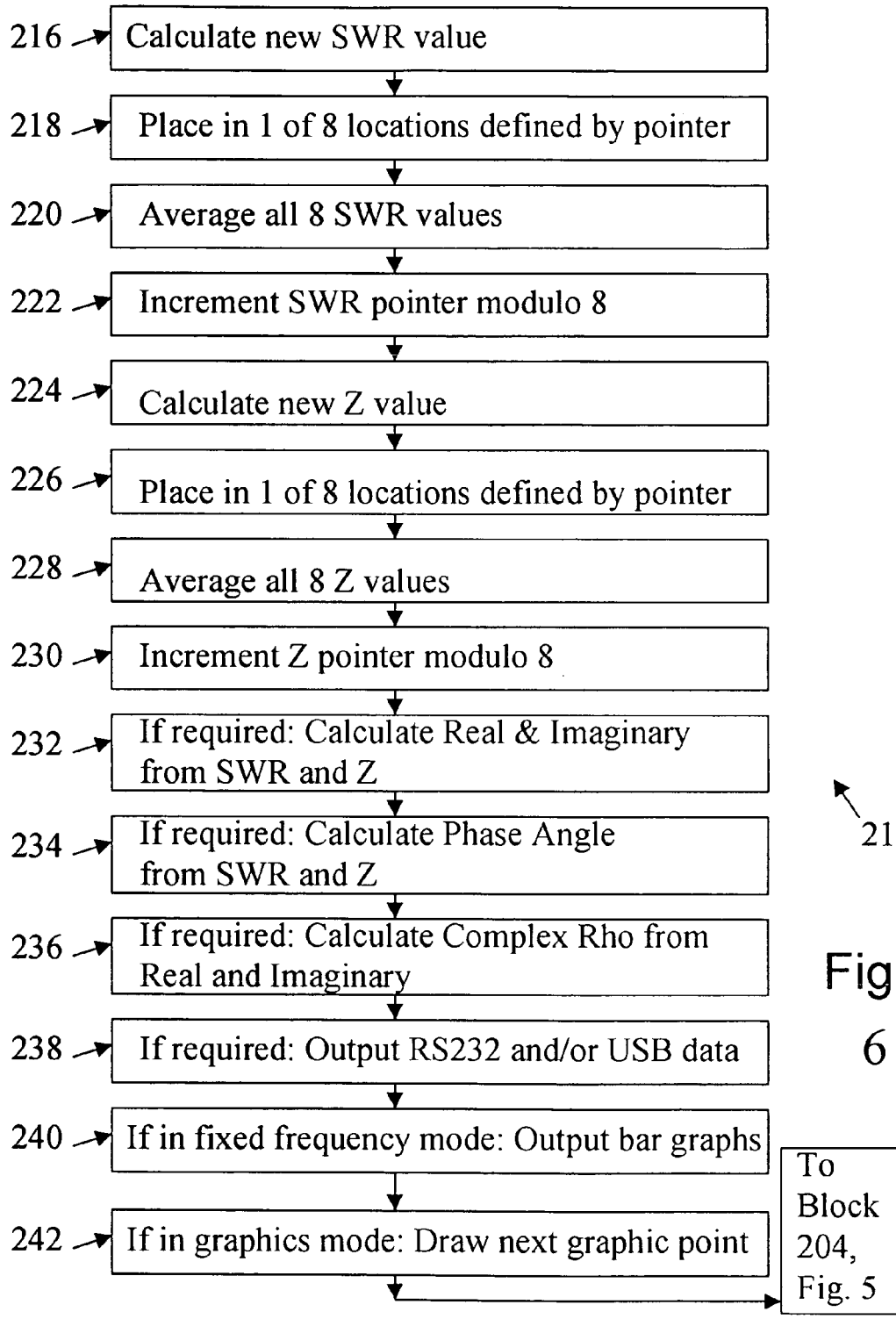
FIG. 6 is a detailed flow diagram of data handling, calculation and data display routines executed by the main microcontroller of the FIG. 2 analyzer.

Data handling and display processes carried out by CPU 104 are graphed in the flowchart of FIG. 6. When main loop block 214 is entered, a step 216 is reached at which CPU 104 calculates a new SWR value. At step 218, the newly calculated SWR value is placed in one of a plurality (e.g. eight) memory locations as pointed to by a pointer. At step 220 the CPU 104 averages all eight of the most recently measured SWR values stored in the eight memory locations by summing the stored values and dividing by eight. And, at step 222 the CPU 104 increments the pointer address by modulo 8. Steps 216-222 thereby implement a moving average SWR calculation process.

At a step 224, the CPU 104 calculates a new value Z. This Z value is placed in one of eight memory locations at a step 226. And, at step 228 the CPU 104 averages the latest eight Z values in the eight memory locations. At a step 230, the CPU 104 increments the Z pointer, modulo 8. Steps 224-230 provide a moving average Z determination.

A series of logical and process steps then follow within the data handling and display block 214. A step 232 determines if real and imaginary impedance values are needed by a particular mode. If so, these values are determined from the moving average SWR and Z values and recorded in a register. A step 234 determines if phase angle is needed by a particular mode. If so, phase angle is calculated from SWR and Z and recorded in a register. A step 236 determines if complex reflection coefficient RHO comprising magnitude and phase is needed by a particular mode. If so, RHO is calculated from the real and imaginary values determined at step 232 and stored in a register. A step 238 determines if a serial data output mode is active. If so, serial data is output via a selected port 112 or 116. A step 240 determines if the analyzer 30 is operating in fixed frequency mode. If so, the CPU 104 outputs data for bar graph display. A step 242 determines if the analyzer is operating in a graphics display mode. If so, the CPU determines and draws a next point of a graph presented to the user at the LCD display 36. When data is presented in polar coordinate format, multiple frequency sweeps may be employed to present graphical data along a consistent locus without sign discontinuities.

Figure 7A:
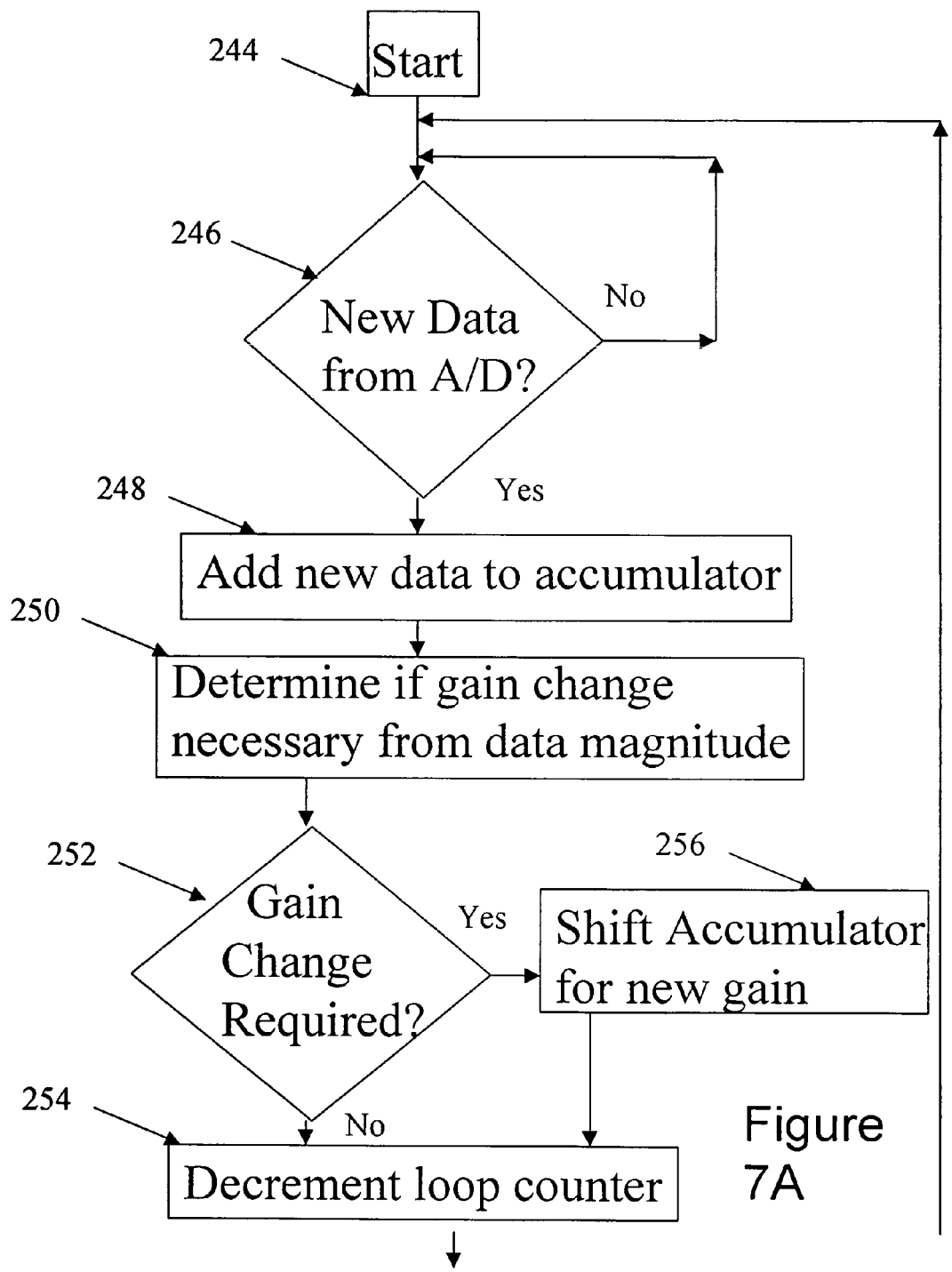
FIGS. 7A, 7B and 7C comprise a detailed flow diagram of a data acquisition routine executed by the main microcontroller of the FIG. 2 analyzer.
Figure 7B:
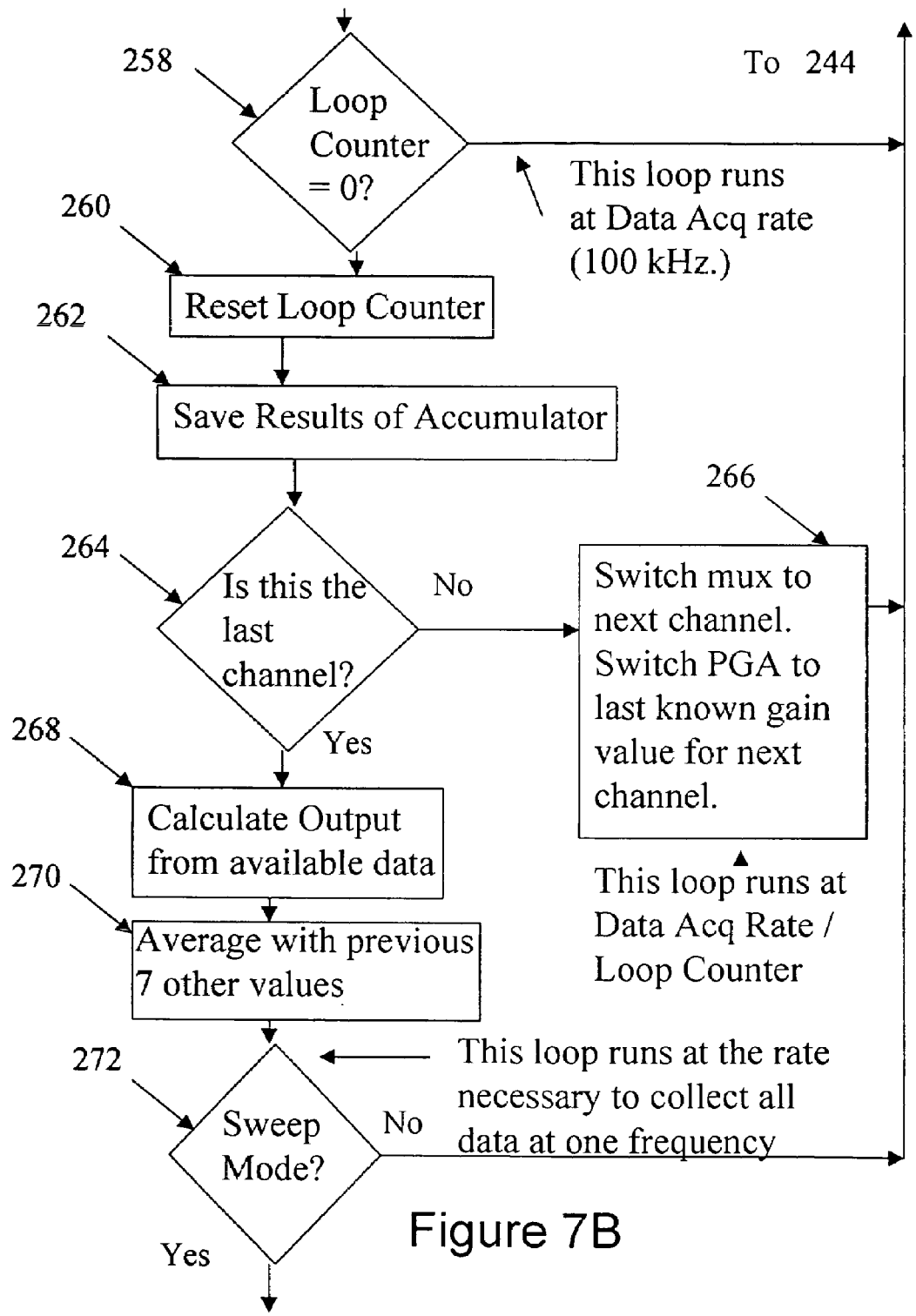
Figures 7C, 8:
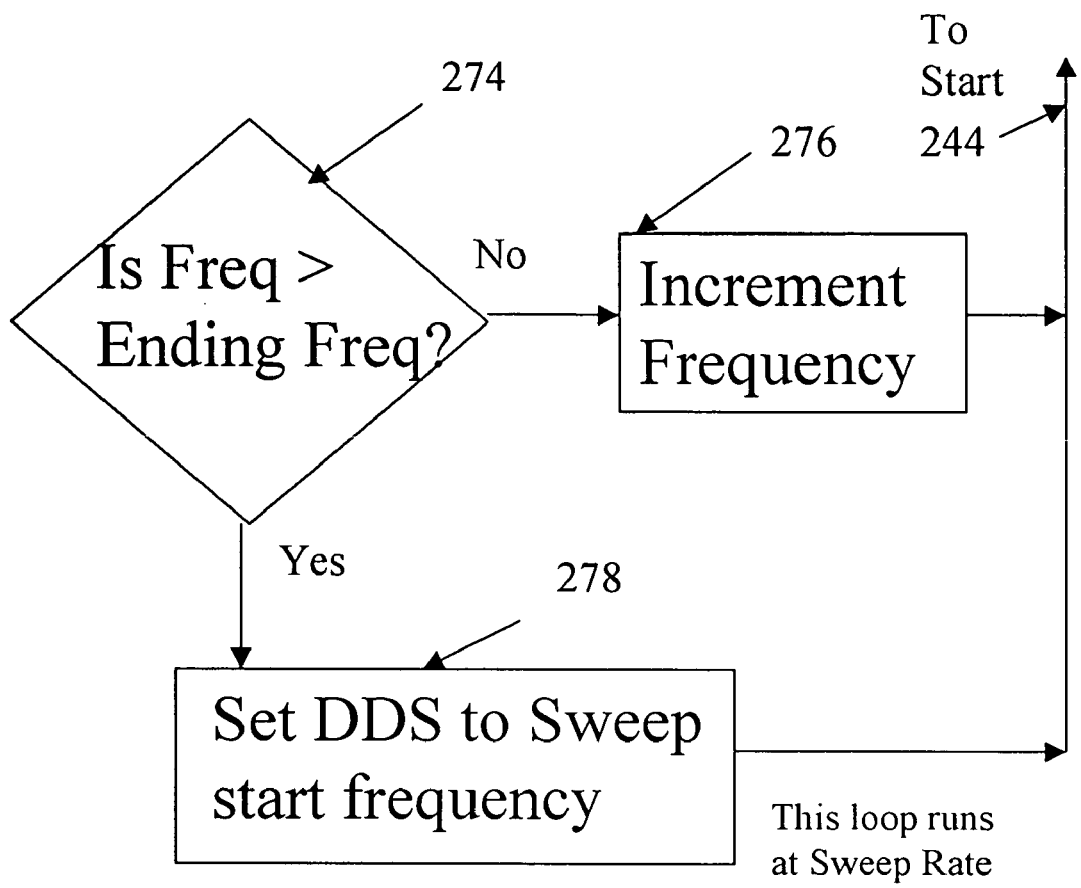
FIG. 8 is a table explaining how a 19.5 bit resolution is achieved within an analog-to-digital conversion process carried out by the FIG. 2 analyzer.

The data acquisition process flow is set forth in greater detail as a single flowchart in FIGS. 7A, 7B and 7C which describes a method for acquiring a single data point within the calculated new SWR block 216 of FIG. 6, for example. Beginning from a starting point 244, a logical node 246 determines whether new data is ready from the A/D 102. If not, the program loops at this point. If so, new data from a single data acquisition input is added to an accumulator of the CPU 104 at a step 248. Next a step 250 determines if a gain adjustment is necessary based upon data magnitude of the A/D data. If a gain change is not required, a step 254 decrements the loop counter. If a gain change is required, as determined at a logical step 252 which determines whether the point quantization data has approached a limit of the A/D amplitude range, the gain of PGA 100 is adjusted up or down, and the CPU 104 shifts the accumulator data right or left to reflect the newly adjusted up or down gain of PGA 100 at a step 256, and then decrements the loop counter at step 254. Steps 252 and 256 comprise a dynamic autogain function, set forth in greater detail in the flowchart of FIG. 9, described hereinafter.

Turning to FIG. 7B, a logical step 258 determines if the loop count has reached zero. If not, a return is made to step 244 and the data acquisition process is repeated for the next data point. If so, the loop counter is reset at a step 260, and the results in the accumulator are saved in a register at a step 262. A logical step 264 asks if the current data channel is the last data channel of the four channels comprising the directional coupler 78. If not, a step 266 switches the multiplexer 98 to the next channel, and switches the programmable gain amplifier 100 to the last known valid gain value for the next channel and then returns to the start block 244 to perform data acquisition for the next channel. The process flow loop including block 266 runs at a rate equal to the data acquisition rate of the A/D 102 (e.g. 100 kHz) divided by the loop count, 16, for example.

If logical step 264 determined that the current channel was the last channel to handle within the data acquisition loop, a step 268 calculates output data from the available data. This output data is then averaged with seven previous output data to provide an output data average at a step 270 (which corresponds to the steps 220 and 228 of block 214 of the main loop 200. In the single frequency loop mode the CPU executes code applicable to data collection and processing for a single frequency. A logical step 272 determines if the analyzer 30 is operating in frequency sweep mode. If not, a return is made to the start block 244 and data collection at a user-selected single frequency is repeated.

Turning to FIG. 7C, if the analyzer is operating in frequency sweep up-count mode as determined at step 272, a logical step 274 determines if the present frequency is equal to a user-set maximum frequency of sweep range. If this frequency has not been reached, a step 276 increments the frequency to the next discrete frequency within the frequency range, and data acquisition at the new frequency is repeated for all channels, beginning at the start block 244. If the maximum frequency has been reached, a process step 278 is reached at which the CPU 104 sets the DDS 70 to the user-selected lowest frequency of the sweep range, and data acquisition at the lowest frequency is initiated for all channels at start block 244. The number of discrete frequencies within a sweep range is limited in order to provide a reasonable sweep time and accurate computational results within the graphic resolution of the display 36. In practice, limiting the number of discrete frequencies within a sweep range to 171 has been found to meet the competing aspects of accuracy and resolution. With e.g. 171 data points and four input data channels, and with the A/D 102 sampling at 100 kHz, each sweep takes about two seconds. Sweep mode continues repeatedly until the user enters a Stop-Sweep command at one of the pushbuttons, e.g. push button 48. The user is visually prompted to this particular button 48 by a label presented in associated graphic display block 68 labeled "Stop SWP", for example.

An explanation as to how the analyzer 30 achieves a 19.5 bit effective data resolution is set forth in FIG. 8. The A/D 102 has a nominal 12 bits resolution. The PGA 100 uses four different CPU selectable levels in powers of two. This capability adds four bits. Since the loop count equals 16, the improvement equals the square root of 16 or four, meaning that an additional two bits resolution is achieved by the loop count. Finally, since all output data is averaged over eight samples per channel, the improvement equals the square root of eight, or approximately 1.5 bits. In total, 19.5 bits effective data dynamic range is achieved by the processes outlined in FIGS. 5, 6, 7A, 7B, 7C, and FIG. 9.

Figure 9:
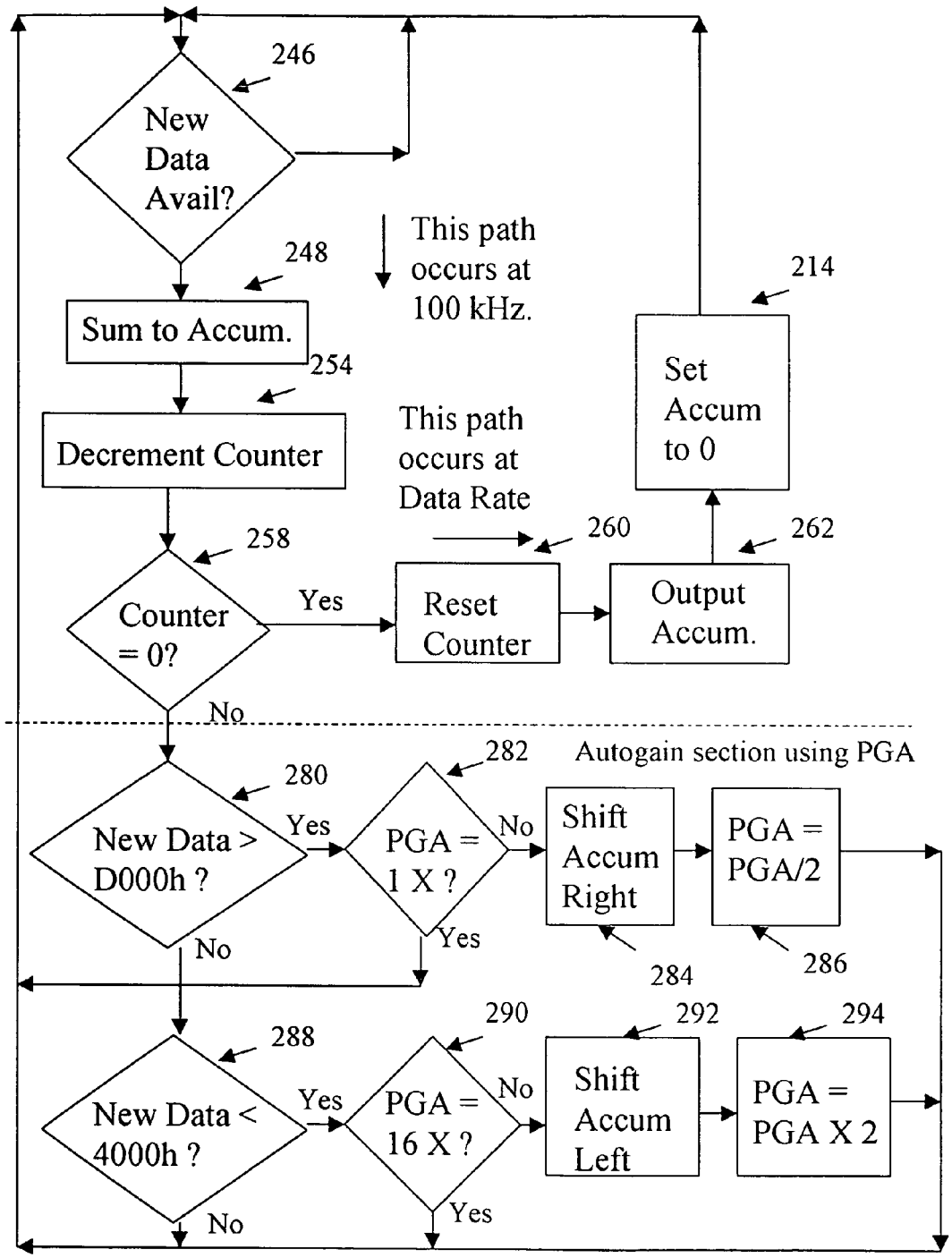
FIG. 9 is a detailed flow diagram showing autogain control within the analog-to-digital conversion process of the FIG. 2 analyzer.

FIG. 9 sets forth in greater detail an autogain strategy employed within block 214 of the main loop. Process steps which are the same or are part of steps set forth in FIGS. 6, 7A, 7B, or 7C are given the same reference numeral. New steps 280-294 are carried out within autogain logical step 252 and process step 256 set forth in FIG. 7A. While the A/D 102 has an effective quantization data range between 0000 (Hex) and FFFF (Hex) it is most effective when it provides the largest number of quantization bits within its useful range. Therefore, it is useful to limit the quantization data to lie within a large bit quantization range, such as between 4000 (Hex) and D000 (Hex). Accordingly, logical step 280 determines whether the latest analog channel data quantized by the A/D 102 is greater than D000 (Hex). If so, a logical step 282 determines whether the PGA 100 is at its lowest gain setting (e.g. unity). If so, no change is made to the accumulator or to the PGA, and process flow passes back to block 246 for the next channel data. If not, the data in the accumulator is shifted right one bit position at a process step 284 and the gain of PGA 100 is divided by two at a process step 286. The next time data from this channel is accessed, the effect of the data shift right in the accumulator and the halved gain of the PGA 100 will take effect. If the latest data is less than D000 (Hex) and also less than 4000 (Hex) as tested at a logical step 288, a logical step 290 then determines if the PGA 100 is set at maximum gain (e.g. $2^5$ or 16 times). So, no change is made to the accumulator or to the VGA 100. If not, a process step 292 shifts the data in the accumulator one bit position to the left, and a process step 294 increases the gain of PGA 100 by a factor of two. Again, the next time data from this channel is accessed, the effect of the data shift left in the accumulator and the doubled gain of the PGA will take effect.

As will be appreciated from the foregoing discussion, the exemplary analyzer 30 is very capable and very flexible. Measurements may be taken at a fixed frequency, or over a frequency range by "sweeping" i.e. generating a series of discrete progressively changing frequencies across a user-set range. With the exemplary analyzer 30, measurements preferably are displayed for standing wave ratio (SWR) and real and imaginary impedance (displayed in rectangular graphic format); and, complex reflection coefficient Rho and Smith Chart (displayed in polar graphic format). Additional software may be provided with the analyzer 30 enabling display of inductance or capacitance at a user-determined single frequency, and directly read coaxial cable length. With the optional field strength detector 92 and software, field strength may be measured and displayed. Data can be presented as bar graphs, numerical data, X-Y graphs, Freq-Y graphs, Smith charts, etc.

Figure 10:
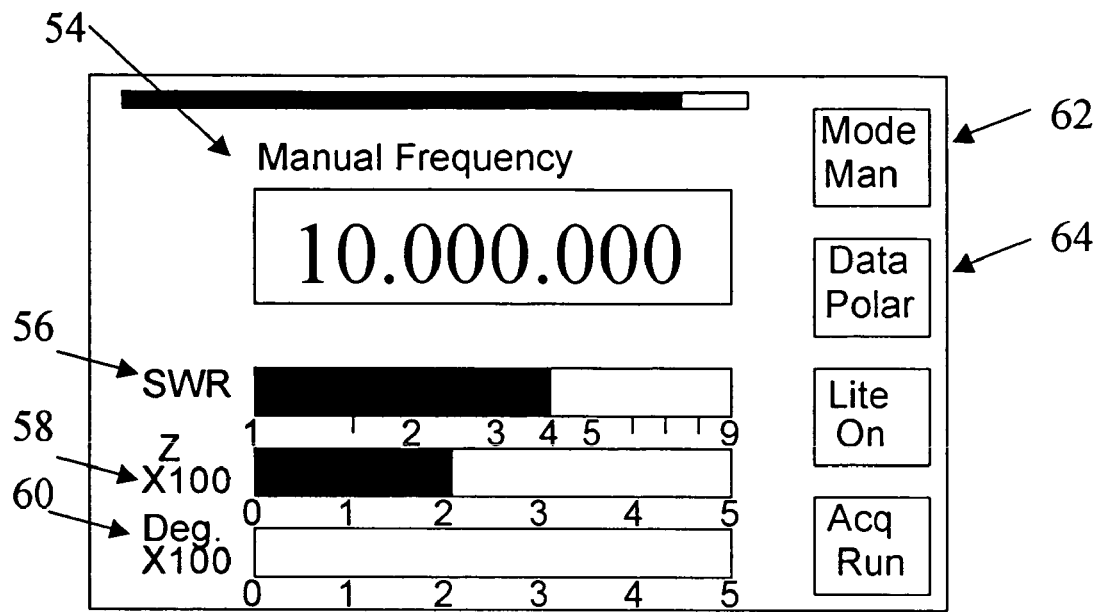
FIG. 10 is a depiction of an exemplary analyzer display screen showing the single frequency mode.

FIG. 10 shows a screen depiction of a mode display depicting operation at a single frequency, e.g. 10 MHz. In the FIG. 10 display, the field 54 is labeled "Manual Frequency" and reads "10.000.000", denoting 10 MHz. The Field 56 is labeled "SWR" and is a horizontal bar graph along a series of graduations indicating measured SWR at the 10 MHz frequency. The field 58 is labeled "Z X 100" and is a horizontal bar graph along a series of graduations indicating measured Z times one hundred. The field 60 is labeled "Deg. X 10" and is a bar graph along a series of graduations marking zero through 90 degrees of phase. Switch function box 62 prompts the user to change the mode while simultaneously displaying the presently selected mode. Depressing associated pushbutton 42 will progressively advance the analyzer 30 through its range of operational modes, including Manual Frequency, Sweep, and High Resolution Frequency Generation. Switch function box 64 prompts the user to select the data to be displayed while indicating the presently selected display mode. In manual frequency mode, by depressing associated pushbutton 44 the user will be able to view data progressively displayed as SWR, Z and phase in degrees; and, SWR, Real X100 and Imaginary X100.

Figure 11:
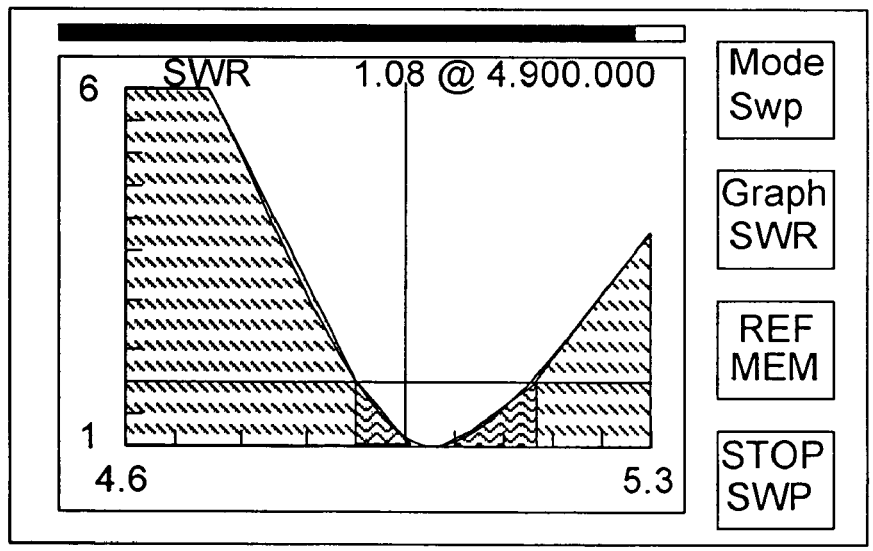
FIG. 11 is a depiction of an exemplary analyzer display screen showing a frequency sweep mode graph of SWR amplitude of a device measured across a user-specified frequency sweep range.

FIG. 11 illustrates a sweep mode display. In this display mode, for example, measured SWR amplitude of the device under test is presented in a frequency range starting at 4.6 MHz and ending and 5.3 MHz. A central vertical line in the graph is a user adjustable cursor which may be swept back and forth across the graph by rotating the encoder in one direction or the other. Frequency and SWR data at the cursor location along the graph is presented in two boxes to the upper right of the cursor. In this example, the cursor line is set at 4.950 MHz and the SWR is 2.04 to one. The pushbutton prompt boxes read MODE SWP, GRAPH SWR, REF MEM and STOP SWP. Pressing the associated push button will respectively change the mode, change the graph, allow reference memory access, and stop the sweep. The horizontal line across the sweep display indicates a SWR of two to one. Where the SWR data is above two to one, the graph is e.g. red in color. Where the SWR data is at or below two to one, the graph is e.g. green in color.

Figure 12:
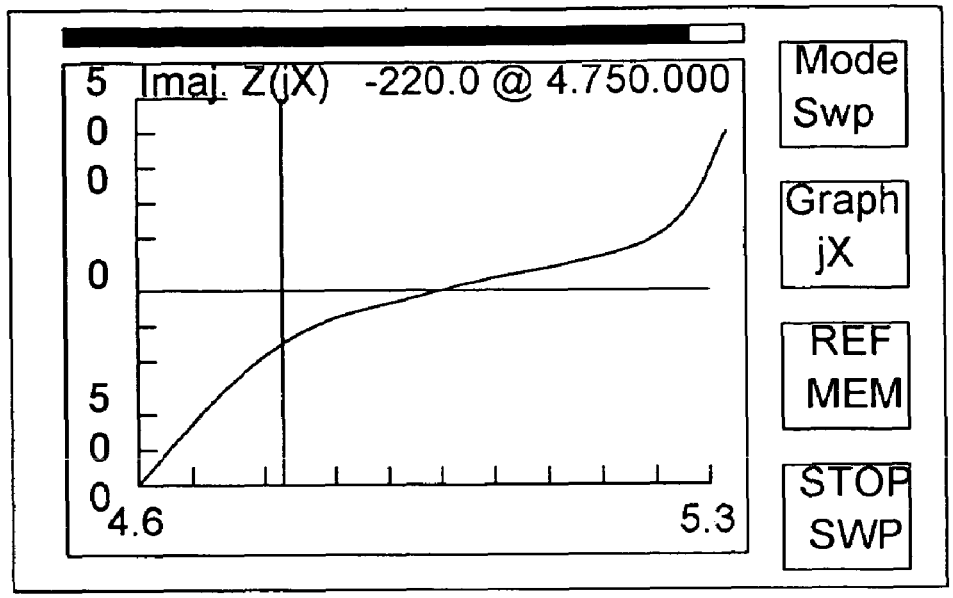
FIG. 12 is a depiction of an exemplary analyzer display screen showing an X-Y Cartesian coordinate plot of the imaginary component of impedance across a sweep of radio frequencies.
Figure 13:
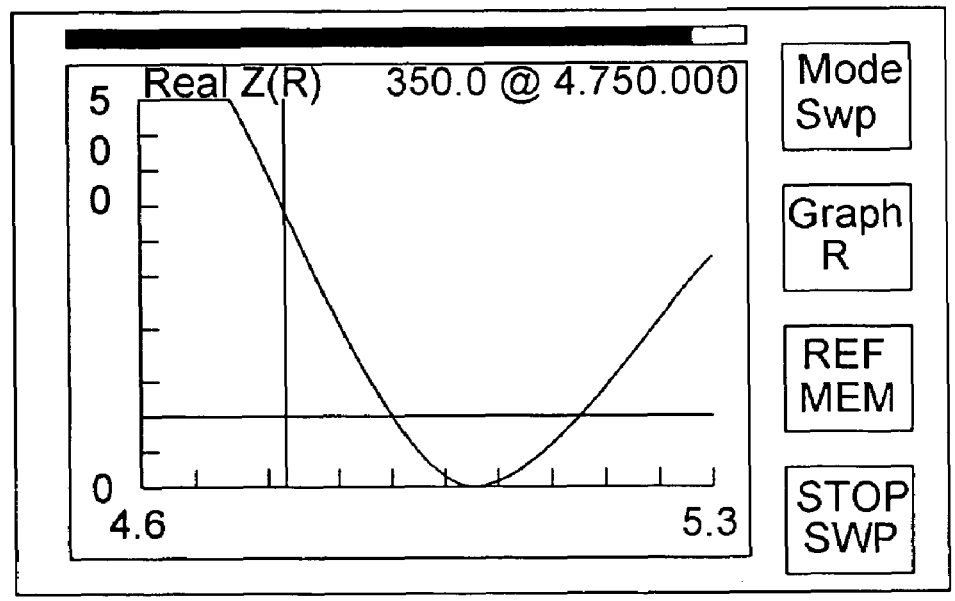
FIG. 13 is a depiction of an exemplary analyzer display screen showing the real component of an impedance of a device measured across a frequency sweep.
Figure 14:
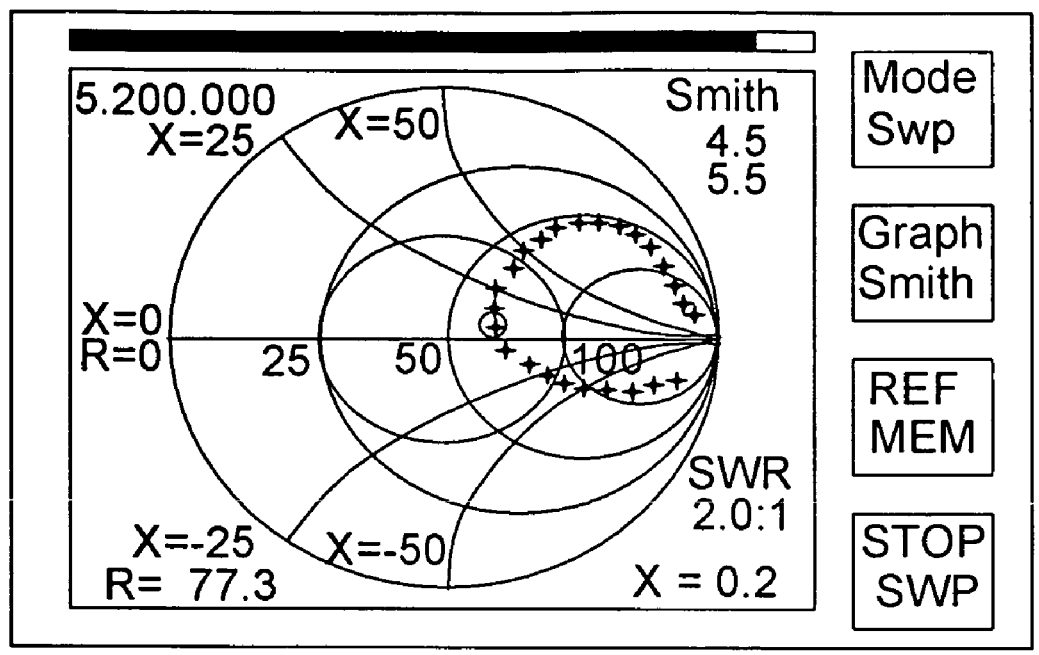
FIG. 14 is a depiction of an exemplary analyzer display screen showing complex impedance of a device measured across a frequency sweep and presented as a Smith Chart plot.

FIG. 12 illustrates an X-Y plot of the imaginary component of impedance across a frequency sweep. A corresponding X-Y plot of the real component of impedance across the same frequency sweep is shown in FIG. 13. FIG. 14 shows the impedance data depicted in FIGS. 12 and 13 as a Smith Chart plot, wherein the data curve trace passes through abscissa axis at the resonant frequency of 5.2 MHz. The Smith Chart plot shown in FIG. 14 is created by superimposing a complex voltage magnitude reflection coefficient Argand diagram onto a Smith Chart graphic, such that the real components of the complex coefficient are plotted along the horizontal axis and the reactive components of the complex coefficient are plotted along the vertical axis.

The word "SMITH" appears in the upper right hand corner of the FIG. 14 display. Underneath the field "SMITH" appears a starting frequency field, in this example "4.5" denoting a 4.5 MHz sweep starting frequency, and below that an ending frequency field, in the present example "5.5" denoting a 5.5 MHz sweep ending frequency. A graph scale factor field in the lower right hand corner of the FIG. 14 display sets forth the scale of the central circle of the displayed Smith Chart (e.g. yellow in the color display). In this example, the central circle represents an SWR of 2.0:1. Whenever the measured SWR is less than 2.0:1, the display trace will define a locus of data points within the central circle of the FIG. 14 graph, for example. The scale factor, e.g. 2.0:1 is user adjustable and may be set by selecting the Smith SWR field of the FIG. 16 graphic setup window and adjusting the value by rotating the encoder shaft 50. The curved locus of dots (green in the color display) represent actually measured data points over the frequency sweep. Each point corresponds to the apex of a single vertical line drawn at a horizontal position on the X-Y (Argand) graph corresponding to a particular single frequency of measurement within the sweep range. To determine the frequency at any one of the displayed data points the sweep is stopped and the user rotates the encoder 50 to move a circular marker (small yellow circle in the color display) from point to point along the graph locus until the point of interest is reached (shown in the upper left hand quadrant of the display. When that point is reached, a field in the upper left hand corner of the display shows the frequency of excitation generating the selected data point, in this example, 5,200,000 Hz. In the FIG. 14 Smith Chart display, resistive impedance is labeled along the horizontal axis. Inductive impedance is labeled around the edge of the Smith circle on the top half plane, and corresponding capacitive impedance is shown on the lower half plane. With the test example shown in FIG. 14, the impedance passes through the central 2.0:1 SWR circle, but never passes through the center of the graph which marks the ideal 50 ohm resistive, zero ohm reactive match point.

Figure 15:
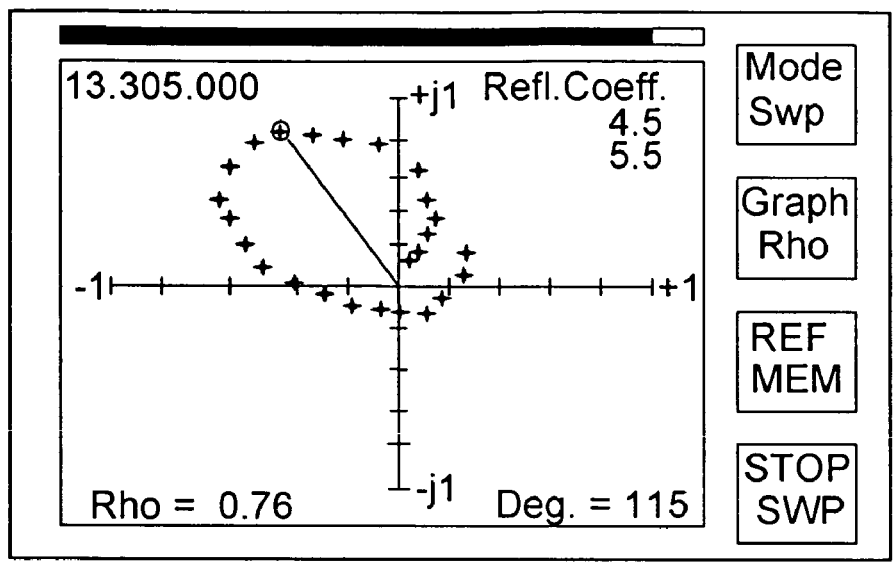
FIG. 15 is a depiction of an exemplary analyzer display screen showing a data measurement and display of complex reflection coefficient (RHO) as a phasor plot in a polar coordinate graph.

FIG. 15 presents a graph of the measured complex reflection coefficient RHO which is generated in the same manner as the result presented in the Smith Chart graphics format of FIG. 14, except that RHO magnitude and angle output data are presented as a phasor rotating about a central point on a polar coordinate graph. The FIG. 15 complex reflection coefficient display tracks the same data locus points tracked by the Smith Chart graphics format for the same measurement data in function of frequency. The magnitude of the phasor is given as "RHO" in the lower left corner of the display screen and the angle of the phasor is given as "DEG" in the lower right corner of the same display screen.

Figure 16:
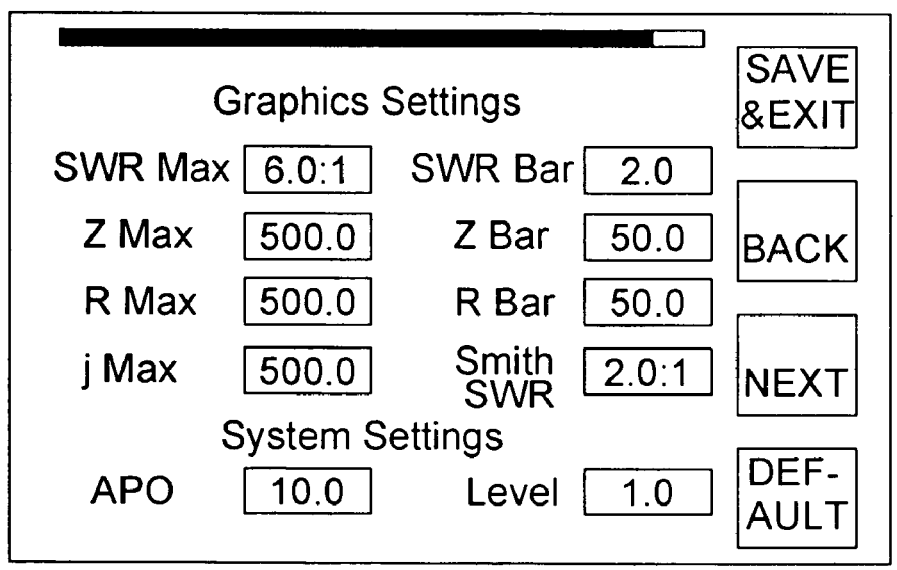
FIG. 16 is a depiction of an exemplary analyzer display screen showing a setup window in which the user may manipulate and set desired parameters for graphic display of measurement results.
Figures 17, 18:
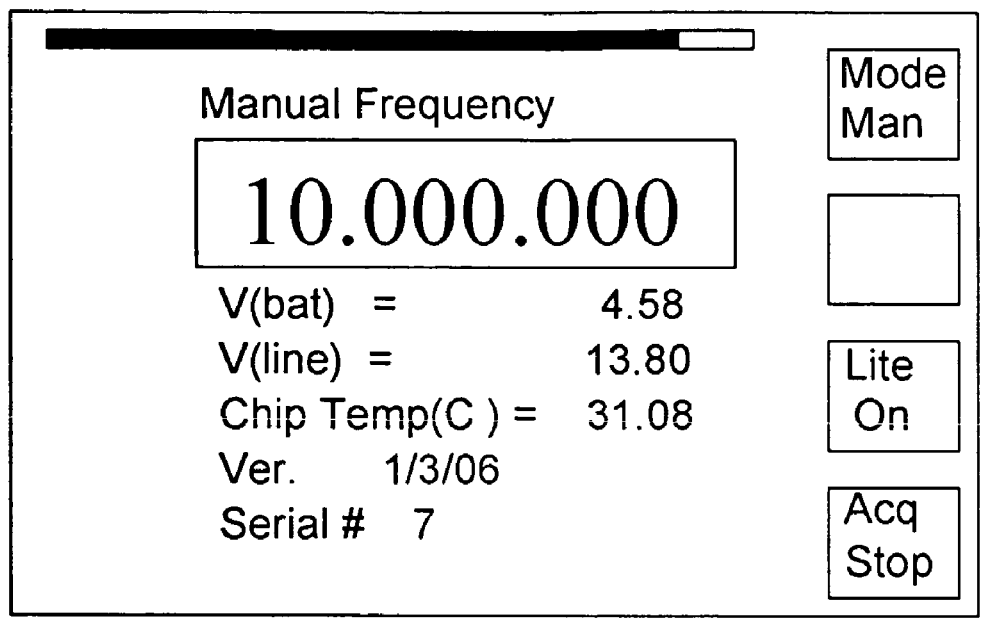
FIG. 17 is a depiction of an exemplary analyzer display screen showing a status window display mode of the FIG. 2 analyzer.
FIG. 18 is a depiction of an exemplary analyzer display screen showing a memory sweep option select window display mode of the FIG. 2 analyzer.

FIG. 16 depicts a graphic setup window enabling the user to enter desired parameters for graphical display. For each of the different graph types a maximum value and a useful fiducial can be set. In addition, the tie desired for the power off timer and other system settings can be entered by the user. FIG. 17 depicts a status mode indicating the DDS output frequency, internal battery voltage, line voltage for charging, and VLSI chip temperature of the CPU 104 and its related circuit elements. FIG. 18 depicts a sweep option select window that presents a series of sweep range options selectable by the user. Each consecutively numbered storage location indicates a band name, a starting sweep frequency and an ending sweep frequency. For example, the storage location number 5 indicates that the band is "20 meters", the starting sweep frequency is "14.000.000" Hz and the ending sweep frequency is "14.350.000" Hz (with periods substituting for the more conventional commas in frequency notation). By selecting a field with a push button, the user can thereby rapidly select and use one of the available stored sweep ranges by depressing the "STRT SWP" push button. An edit file name function is also provided at the FIG. 18 display.

Figures 19, 20:
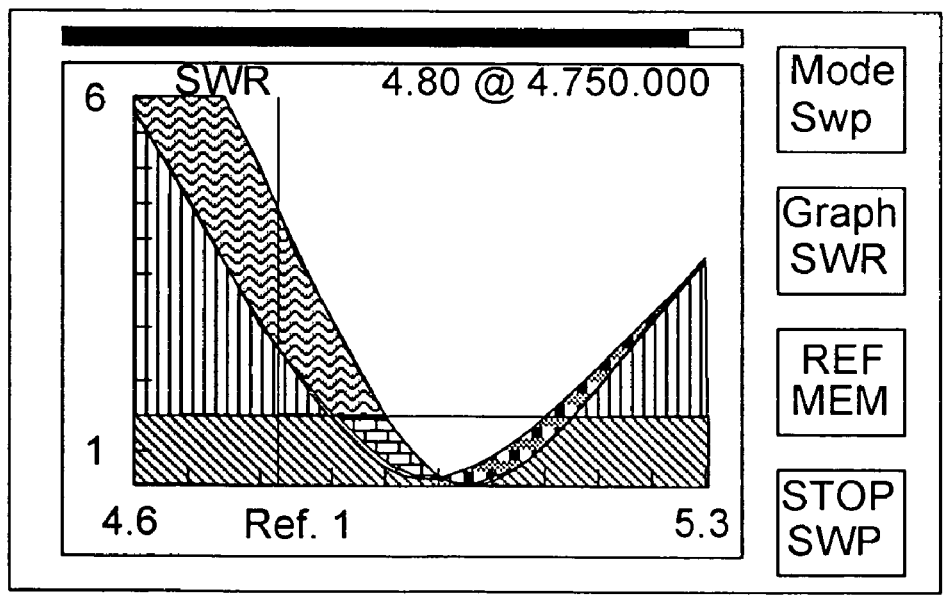
FIG. 19 is a depiction of an exemplary analyzer display screen showing a reference memory sweep option select window display mode of the FIG. 2 analyzer.
FIG. 20 is a depiction of an exemplary analyzer display screen showing comparison of a previously saved measurement of e.g. standing wave ratio to a current measurement of the same parameter over the same sweep width, enabling the user to assess any changes.

FIG. 19 depicts a reference memory sweep option select window comprising rows of consecutively numbered storage locations. Each storage location comprises a complete data set of measured values obtained from a user-selected sweep within a measurement environment. The data set includes all of the available measurement parameters collected during the sweep, and the starting and ending sweep frequencies for the particular measurement are displayed. The user is able to provide a suitable reference memory name. For example, storage bin number 5 is labeled "Dipole" and stores data values collected by the analyzer 30 between 7.201.000 Hz ad 8.300.000 Hz while being connected to the user's "dipole". During a typical frequency sweep sequence, if the user depresses the "REF MEM" button (see FIG. 11), the analyzer presents the FIG. 19 display screen. By manipulating the rotary encoder, the user can select one of a plurality of available (e.g. 10) memory slots. Following slot selection, the user presses the "SAVE REF" button, and the CPU 104 saves to flash memory 122 all of the data necessary to generate any of the available graphics displays associated with the current operational mode. FIG. 20 presents a graphical comparison in color contrast of a current measurement superimposed upon data read from a reference memory slot. This feature enables the user rapidly in real time, and advantageously at a field adjustment site, to ascertain electrical effects of adjustments or changes of the device being measured or adjusted ("tuned").

Figure 21:
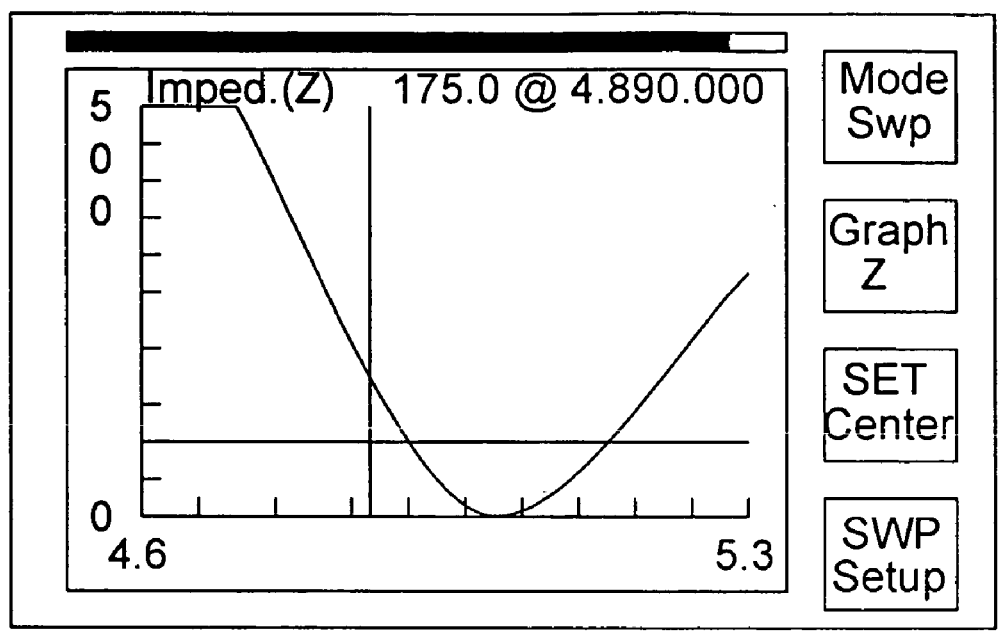
FIG. 21 is a depiction of an exemplary analyzer display screen showing positioning of a cursor to a center location of a spectrum of interest.
Figure 22:
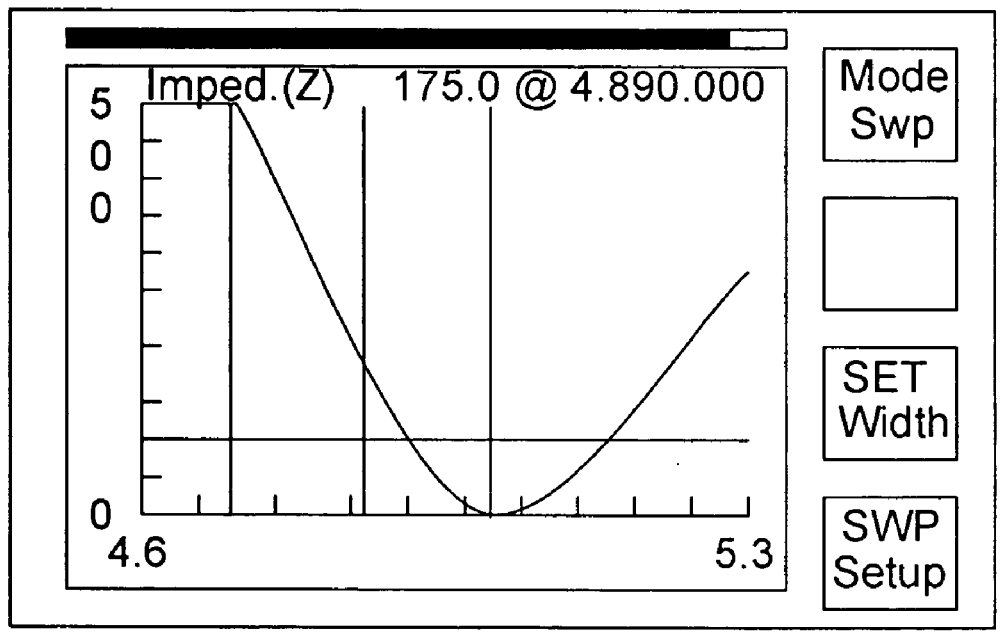
FIG. 22 is a depiction of an exemplary analyzer display screen showing the use of the encoder knob to set two simultaneous cursors to adjust symmetrically sweep end points spanning the FIG. 21 set point.

FIGS. 21 and 22 illustrate the rapid graphical set-sweep function of the analyzer 30. This function is entered from the sweep mode after it has been stopped. When the sweep is stopped, a "SET Center" box and button is presented to the user. If the user presses the SET Center button, two additional vertical cursors are presented equidistantly from the original vertical cursor, as shown in FIG. 22. Rotation of the encoder shaft causes the two newly presented cursors to move toward or away from the center frequency. Once the user has thus rapidly selected the desired frequency sweep span, by pressing the "Set Width" button, the analyzer 30 begins sweeping within the newly selected frequency range. The user is aided in determining center frequency and sweep range by the spectral information already presented graphically to the user by the analyzer. For example, in frequent test environments, multiple peaks or dips may be apparent from the initial frequency sweep and display. The user may be particularly interested in only a single dip or peak, and use the presently described graphical-set sweep function to focus analysis solely upon the dip or peak of interest.

Figure 23:
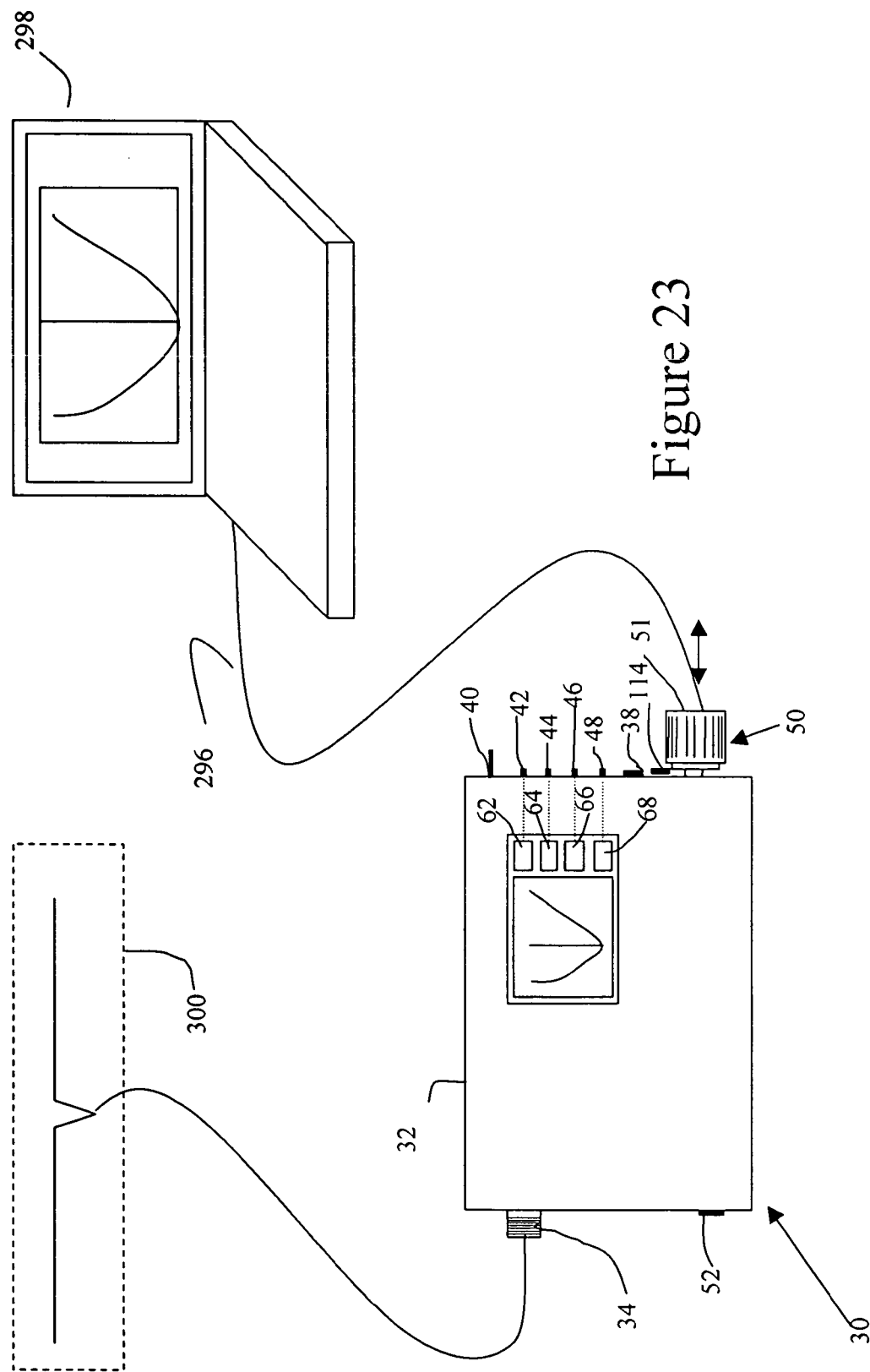
FIG. 23 is a diagrammatic view of one preferred embodiment of the analyzer of the present invention showing measurement of a device under test (or stored results of previous measurement(s)) and connection to a computer through the use of a universal serial bus connection to display measurement results.

FIG. 23 illustrates the connection of the analyzer 30 to a laptop personal computer 298. In the example shown, the preferred connection is through the use of a universal serial bus cable 296 from USB port 114 to the appropriate USB port on the laptop computer 298. When operated in this optional manner, real time data obtained from a device under test depicted by block 300 can be displayed simultaneously on the analyzer 30 and the computer 298. Alternatively, one or more tests may be performed in the field and stored in the memory locations of the analyzer 30 and thereafter recalled and downloaded via the USB port 114 to the laptop computer 298 for further analysis and/or display. In addition complete functional control of the analyzer 30 can be carried out by a laptop user controlling software in the computer with commands communicated to the analyzer 30 through the USB cable 296. Thus, it is possible to upload and download all measurement data and user configuration settings of which the analyzer 30 is capable of storing.

In the prior art, inaccuracies occur in either SWR measurements as the SWR approaches a ratio of 1:1 or in or impedance measurements when the magnitude of the complex impedance approaches zero ohms. This is typically caused by the fact that the diodes shown in the directional coupler element of FIG. 3A have a small offset voltage before they begin to conduct. As the condition of the SWR approaching 1:1 or the magnitude of the complex impedance approaching zero ohms do not occur simultaneously and as more accurate results can be obtained for either of these two measurements when the other measurement is considered, the analyzer uses SWR measurement data to determine impedance in lieu of the impedance data when the impedance data is determined to be too low to be accurately measured by the impedance bridge. Similarly, the analyzer uses impedance measurement data to determine SWR when SWR is determined to be approaching 1:1. This approach enables the analyzer to modify the results made by one measurement by the results of the other measurement when greater accuracy results from this modification and phase information can be ignored.

In the prior art of handheld antenna analyzers, the sign of the imaginary part of the impedance vector was indeterminate thus not allowing the use of a polar type of display such as the Smith chart or reflection coefficient display. In the exemplary antenna analyzer 30, additional information, e.g. impedance discontinuities in previously measured sweeps, the change of impedance as a function of frequency, the need for a continual clockwise rotation of the impedance vector as viewed on a polar chart, is used to aid in the determination of the phase sign at each separate frequency point within a frequency sweep. This approach removes the need for the additional electronic hardware circuit complexity otherwise needed for phase sign determination.

In the prior art, users frequently measure antennas by connecting to feedlines extending over unmeasured distances to the antenna feed point, as by connecting the analyzer to the transmission line 24 at the transmitter end in the FIG. 1 measurement environment. Unless the electrical length of the transmission line 24 is known or carefully measured, the transmission line may affect and distort the antenna impedance measurement at a particular frequency, with the result that the analyzer can determine antenna resonance but not feed point impedance. If the user measures the antenna impedance at the feed point 22, the user has placed himself or herself into the antenna's near field, and this presence of the user may distort the antenna measurements taken directly at the antenna feed point.

When using the exemplary antenna analyzer 30 to measure the characteristics of an antenna, it is not necessary to measure the unknown impedance directly at the antenna's feed point 22, providing the transmission feedline impedance has first been characterized and recorded. The exemplary analyzer 30 includes a transmission line measurement mode to measure the actual impedance of the antenna even when connected to a length of transmission line. This procedure includes characterizing the transmission line by making a measurement with the antenna disconnected from the transmission line and in a known termination state, saving the transmission line measurement results in flash memory 122, and later recalling and using the saved transmission line measurements in carrying out a compound calculation of antenna measurement results from data collected remotely via the same transmission line after it has been connected or reconnected to the antenna feed point. This function of the analyzer 30 enables the user to analyze the antenna accurately at a distance, such as at the transmitter end of transmission line 24 in the FIG. 1 diagram, thereby removing the user from being within, and thereby disturbing, the near-field characteristics of the antenna during the measurement process.

When an ideal disconnected transmission line is measured with the analyzer 30 operating in sweep mode, the measurement results in a total reflection of the power applied and an infinite SWR. The electrical length of the transmission line can easily be ascertained by observing the complex input impedance of the transmission line as a function of frequency. As frequency is swept upward, the magnitude of the impedance of the non-loaded (open, or shorted) ideal line will go through a series of cyclic values varying from a very high impedance to a very low impedance. If the line is sufficiently long and the frequency generator has sufficient sweep range, a number of these cycles can be quantified and the electrical length of the line will be calculated by the CPU 104. If the measurement results are viewed on the Smith Chart display, each cycle represents one rotation around the chart on the outer circle (RHO equal to unity). In addition, if the transmission line is non-ideal (e.g., lossy), the amplitude range the cycles go through will diminish with increasing frequency, thereby enabling the analyzer to quantify the loss of the non-ideal transmission line. On the Smith Chart this measurement is seen as the data locus spiraling inwards.

By storing the complex impedance seen for each frequency of interest for a given transmission line in the flash memory 122, the CPU 104 can then determine a feed point impedance by mathematically correcting for the effect of the transmission line after it has been connected (or reconnected) to the antenna feed point (e.g. feed point 22 in FIG. 1) and thus more accurately determine the complex value of the unknown antenna impedance at the end of the transmission line. This feature enables the user to move away from the antenna (where his or her presence actually affects the measurement) to a more convenient location. The analyzer lets the user assign a unique name to each transmission line which has been measured and stored in flash memory, so that the correct information can later be recalled from a table and used for remote measurement of an antenna feed point impedance to which the transmission line has been connected.

To facilitate tuneup of an antenna, the analyzer 30 includes a field strength measurement mode. In this mode the user places the analyzer distantly from the antenna being tuned or aimed. A large single bar graph displays relative field strength to aid the user in tuning the antenna e.g., for maximum power transfer, or for positioning the antenna or checking its directional or angular radiation properties. An optional calibrated antenna may be used with the field strength measurement detector 92 to provide quantitative measurements of field strength.

Due to component variations, each individual analyzer must be calibrated to achieve highest possible measurement accuracy. A calibration function is carried out by taking measurements of highly accurate calibration components and sources, storing the results of the calibration measurements in flash memory, and using the results to determine calibration factors that are used in subsequent measurements. Calibration thus removes unwanted influences of a variety of disturbances that otherwise would make the measurement less accurate. Moreover, the DDS 70 may be calibrated against a known frequency standard, such as the standard frequency signals broadcast at 10 MHz by the U.S. National Bureau of Standards stations WWV and WWVH, for example. Alternatively, the unit may be calibrated by using a precision frequency counter measuring the DDS output signal present at the RF connector 34. In the high-resolution mode, the user is prompted to adjust the DDS to zero beat with the reference signal, while monitoring both signals with a suitable receiver. Calibration is carried out by rotating the encoder knob 51 until the DDS 70 zero-beats with or matches the reference frequency. Then, a function box display prompts the user to save the calibration value in memory for future use by the analyzer in generating calibrated frequency signals with the DDS 70.

Having thus described preferred embodiments of the invention, it will now be appreciated that the objects of the invention have been fully achieved, and it will be understood by those skilled in the art that many changes in construction and widely differing embodiments and applications of the invention will suggest themselves without departing from the spirit and scope of the invention. Therefore, the disclosures and descriptions herein are purely illustrative and are not intended to be in any sense limiting.

What is claimed is:

1. A handheld self-contained digital antenna and/or network analyzer included within a rectangular shaped box, the analyzer having a net weight of approximately less than two pounds with a center of gravity at a region of the box intended to be grasped by a user's first hand and comprising:

a hybrid coupler for directly measuring complex impedance values of a device under test at a given frequency, a direct digital synthesis generator (DDS) for generating the given frequency, a plurality of user-operable input devices, a multimode digital processor unit connected to the plurality of user-operable input devices, for controlling the DDS and including an analog to digital converter and a multiplexer connected to the four-part hybrid coupler, the digital processor unit for calculating and putting out a plurality of data results from data measurements made at the hybrid coupler, a transreflective color graphic display unit controlled by the digital processor unit for receiving at least selected ones of the plurality of data results and for providing a plurality of real time graphic displays of the data results in a plurality of user-selectable graphic formats including a Smith Chart graphic format and at least one additional rectangular or polar graphic format, and having a screen display element visible through a window defined by a front major surface of the box, the plurality of user-operable input devices presented at an endwall of the box adjacent to the screen display element for manipulation by a second hand of the user at a location away from the region at which the box is intended to be grasped, such that at least some ones of the input devices are each physically located to be in association with a corresponding input function display box presented by the screen display element, and a battery power supply for powering the analyzer.

2. The analyzer set forth in claim 1 having user-selectable single frequency and swept frequency modes.

3. The analyzer set forth in claim 1 wherein the hybrid coupler comprises a four-port Wheatstone bridge.

4. The analyzer set forth in claim 1 wherein the user-selectable graphic formats presented by the graphic display unit include at least one of numerical field, bar graph, sweep and line X-Y coordinate, and complex reflection coefficient phasor graph formats.

5. The analyzer set forth in claim 1 providing a software-controlled automatic adjustment of gain to increase effective resolution of the analog to digital converter.

6. The analyzer set forth in claim 5 wherein the analog to digital converter has a nominal 12 bit resolution, and wherein the software-controlled automatic adjustment of gain increases effective resolution of the analog to digital converter to about 19.5 bits.

7. The analyzer set forth in claim 1 further comprising calibration means for enabling calibration of the DDS to an external standard.

8. A handheld self-contained digital antenna and/or network analyzer included within a hand-held housing and comprising:

a hybrid coupler for directly measuring complex impedance values of a device under test at a given frequency, a direct digital synthesis generator (DDS) for generating the given frequency, a plurality of user-operable input devices, a multimode digital processor unit connected to the plurality of user-operable input devices, for controlling the DDS and including an analog to digital converter and a multiplexer connected to the four-part hybrid coupler, the digital processor unit for calculating and putting out a plurality of data results from data measurements made at the hybrid coupler, wherein the multimode digital processor unit includes a remote antenna measurement mode including software defined steps for measuring and recording complex impedance of an open or shorted transmission line and recalling and using the saved feedline impedance values in carrying out a compound calculation of antenna measurement data results collected remotely via the same transmission line after the transmission line has been connected to an antenna feed point, a transreflective color graphic display unit controlled by the digital processor unit for receiving at least selected ones of the plurality of data results and for providing a plurality of real time graphic displays of the data results in a plurality of user-selectable graphic formats including a Smith Chart graphic format and at least one additional rectangular or polar graphic format, and a battery power supply for powering the analyzer.

9. The analyzer set forth in claim 1 wherein the plurality of user-operable input devices includes a rotary shaft encoder generating a pair of binary data streams in quadrature phase relationship.

10. The analyzer set forth in claim 1, wherein the housing has approximate dimensions of 7.5 inches across, 4.25 inches high, and 1.625 inches deep.

11. The analyzer set forth in claim 1 comprising a field strength measurement detector and operating mode.

12. A self-powered handheld measurement instrument including:

a hand-held housing containing a rechargeable battery power supply;

a graphics display module including a graphics controller and a graphic display screen controlled by the graphics controller and visible through an opening in the housing;

directional coupler means for coupling a device under test to the instrument;

a direct digital synthesizer chip for generating radio frequency excitation in a range including at least the High Frequency range;

a plurality of user inputs accessible by the user exteriorly of the housing and including a rotary quadrature encoder and a plurality of user push button switches, the user inputs not including a keypad matrix array;

a mixed analog/digital signal embedded microprocessor including flash memory, the microprocessor being programmed for reading and digitally quantizing measurement values obtained at the directional coupler means, for directly controlling the direct digital synthesizer chip and for controlling the graphics controller to provide multiple computational and display functions to be carried out in response to user inputs at the encoder and switches, the computational and display functions providing a plurality of user-selectable scalar coordinate and polar coordinate display formats presented to the user at a screen of the graphics display module and including a Smith Chart sweep plot and including a Smith Chart sweep plot and at least one of a scalar frequency sweep plot and a polar frequency sweep plot.

13. The instrument set forth in claim 12 wherein the graphics display module includes a transreflective color graphic display screen.

14. The instrument set forth in claim 12 further comprising at least one Universal Serial Bus (USB) port and USB port connector accessible at the housing to enable interconnection of the instrument with an external computing resource.

15. The instrument set forth in claim 12 wherein the microprocessor is programmed to provide a rapid graphical set-sweep function enabling a user rapidly to set frequency sweep range following an initial sweep.

16. A self-powered handheld measurement instrument including:

a hand-held housing containing a rechargeable battery power supply;

a graphics display module including a graphics controller and a graphic display screen controlled by the graphics controller and visible through an opening in the housing;

directional coupler means for coupling a device under test to the instrument;

a direct digital synthesizer chip for generating radio frequency excitation in a frequency sweep within at least the High Frequency range;

a plurality of user inputs accessible by the user exteriorly of the housing;

a mixed analog/digital signal embedded microprocessor including flash memory, the microprocessor being programmed for reading and digitally quantizing measurement values obtained at the directional coupler means, for directly controlling the direct digital synthesizer chip and for controlling the graphics controller to provide multiple computational and display functions to be carried out in response to user inputs at the encoder and switches, the computational and display functions providing a plurality of user-selectable display formats including a Smith Chart graphic format and at least one additional rectangular or polar graphic format presented to the user at a screen of the graphics display module;

the microprocessor programmed to provide a plurality of storage locations in the flash memory for storing a set of data values collected during one frequency sweep, for recalling the data values collected during the one frequency sweep and for graphically displaying a set of data values obtained in a subsequent frequency sweep in overlap and visual contrast with the data values collected during the one frequency sweep.

17. The instrument set forth in claim 12 wherein the microprocessor is programmed to perform at least two frequency sweeps to determine a phase sign of an impedance of a device under test at a particular frequency of interest lying within the sweep range.

18. The instrument set forth in claim 12 wherein the measurement values obtained at the directional coupler means include standing wave ratio (SWR) and complex impedance, and wherein the microprocessor is programmed to use SWR measurement data to determine impedance in lieu of the impedance data when the impedance data is determined to be too low to be accurately measured by the impedance bridge, and to use impedance measurement data to determine SWR when SWR is determined to be approaching a one-to-one ratio.

* * * * *

UNITED STATES PATENT AND TRADEMARK OFFICE
CERTIFICATE OF CORRECTION

PATENT NO.        : 7,271,576 B1
APPLICATION NO.   : 11/361945
DATED             : September 18, 2007
INVENTOR(S)       : Dale G. O'Harra, II It is certified that error appears in the above-identified patent and that said Letters Patent is hereby corrected as shown below:

Column 19, lines 64 and 65, in claim 12, delete repeated phrase "and including a Smith Chart sweep plot".

Signed and Sealed this

Fourth Day of December, 2007

JON W. DUDAS
*Director of the United States Patent and Trademark Office*